(12) United States Patent
Oohata et al.

(10) Patent No.: US 7,148,127 B2
(45) Date of Patent: Dec. 12, 2006

(54) DEVICE MOUNTING SUBSTRATE AND METHOD OF REPAIRING DEFECTIVE DEVICE

(75) Inventors: Toyoharu Oohata, Kanagawa (JP); Toshiaki Iwafuchi, Kanagawa (JP); Hisashi Ohba, Kanagawa (JP)

(73) Assignee: Sony Corporation, Tokyo (JP)

( * ) Notice: Subject to any disclaimer, the term of this patent is extended or adjusted under 35 U.S.C. 154(b) by 426 days.

(21) Appl. No.: 10/165,387

(22) Filed: Jun. 6, 2002

(65) Prior Publication Data

US 2003/0011377 A1    Jan. 16, 2003

(30) Foreign Application Priority Data

Jun. 12, 2001  (JP)  ............................ P2001-176526

(51) Int. Cl.
*H01L 21/00* (2006.01)
*H01L 31/12* (2006.01)
*H01L 27/15* (2006.01)

(52) U.S. Cl. ...................... 438/469; 434/34; 434/982; 434/4; 257/79; 257/81

(58) Field of Classification Search ................ 257/777, 257/686; 361/783, 777
See application file for complete search history.

(56) References Cited

U.S. PATENT DOCUMENTS

| | | | |
|---|---|---|---|
| 4,567,643 A * | 2/1986 | Droguet et al. | ............... 29/832 |
| 5,438,241 A | 8/1995 | Zavracky et al. | |
| 5,793,115 A * | 8/1998 | Zavracky et al. | ............ 257/777 |
| 5,953,216 A * | 9/1999 | Farnworth et al. | .......... 361/777 |
| 6,002,178 A * | 12/1999 | Lin | ............................. 257/778 |
| 6,018,167 A * | 1/2000 | Oota | ............................ 257/99 |
| 6,301,121 B1 * | 10/2001 | Lin | ............................. 361/783 |

FOREIGN PATENT DOCUMENTS

| | | | |
|---|---|---|---|
| JP | 5617385 | | 2/1981 |
| JP | 406089926 | * | 3/1994 |
| JP | 07-014880 | | 1/1995 |
| JP | 07-098569 | | 4/1995 |
| JP | 11-008338 | | 1/1999 |
| JP | 11-142878 | | 5/1999 |
| JP | 11307878 | | 11/1999 |

* cited by examiner

*Primary Examiner*—Carl Whitehead, Jr.
*Assistant Examiner*—James M. Mitchell
(74) *Attorney, Agent, or Firm*—Bell, Boyd & Lloyd LLC

(57) ABSTRACT

A method of repairing a defective one of devices mounted on substrate is provided. Devices are arrayed on a substrate and electrically connected to wiring lines connected to a drive circuit, to be thus mounted on the substrate. The devices mounted on the substrate are then subjected to an emission test. If a defective device is detected in this test, a repair device is mounted at a position corresponding to a position of the defective device. At this time, after wiring lines connected to the defective device are cut off, the repair device is electrically connected to portions of the wiring lines, the portions of the wiring lines being located at positions nearer to the drive circuit side than the cut-off positions of the wiring lines. Since a defective device is repaired by a simple step that is carried out by simply mounting and fixing a repair device without removal of the defective device, it is possible to eliminate the need for any complicated, microscopic work; for example, removal of the mounted devices, and/or selective removal or repair of an insulating layer.

2 Claims, 29 Drawing Sheets

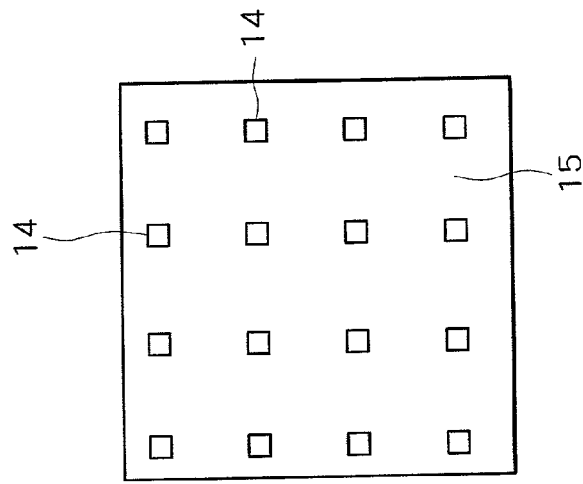
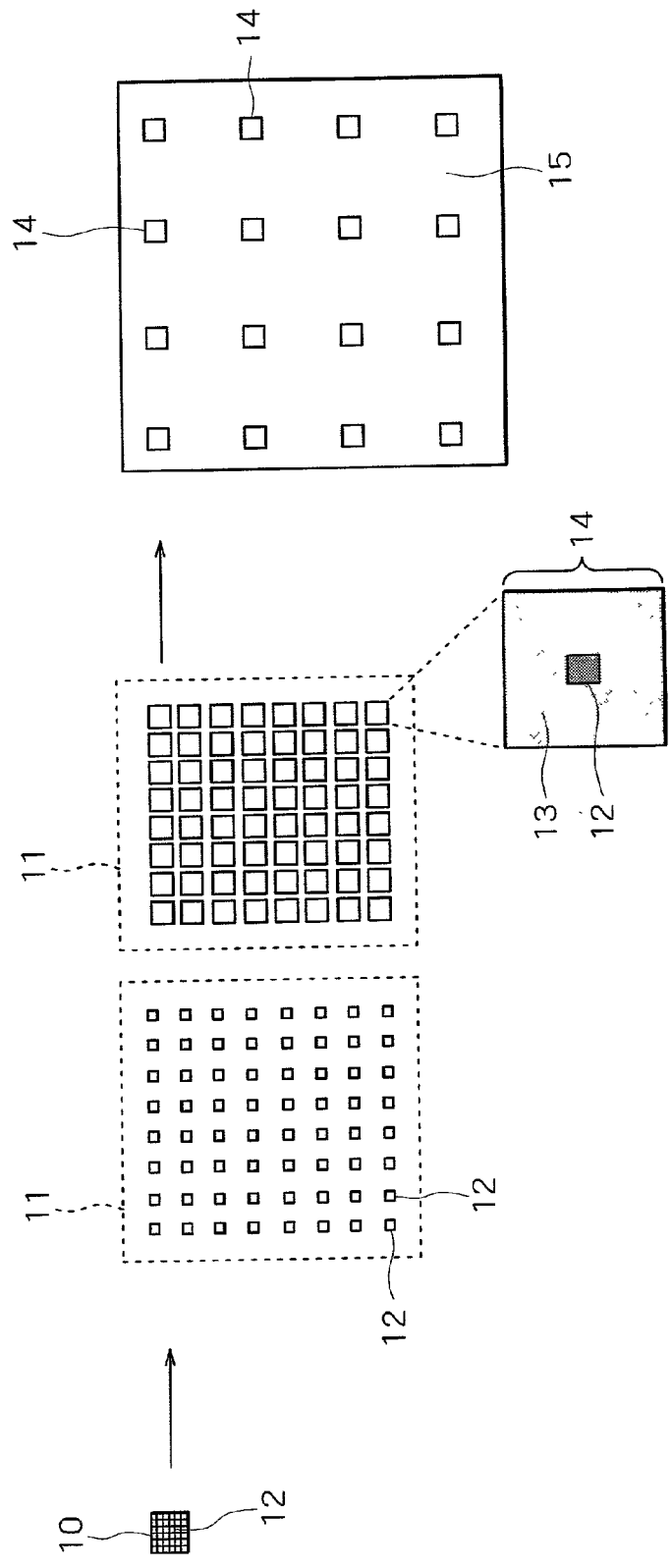

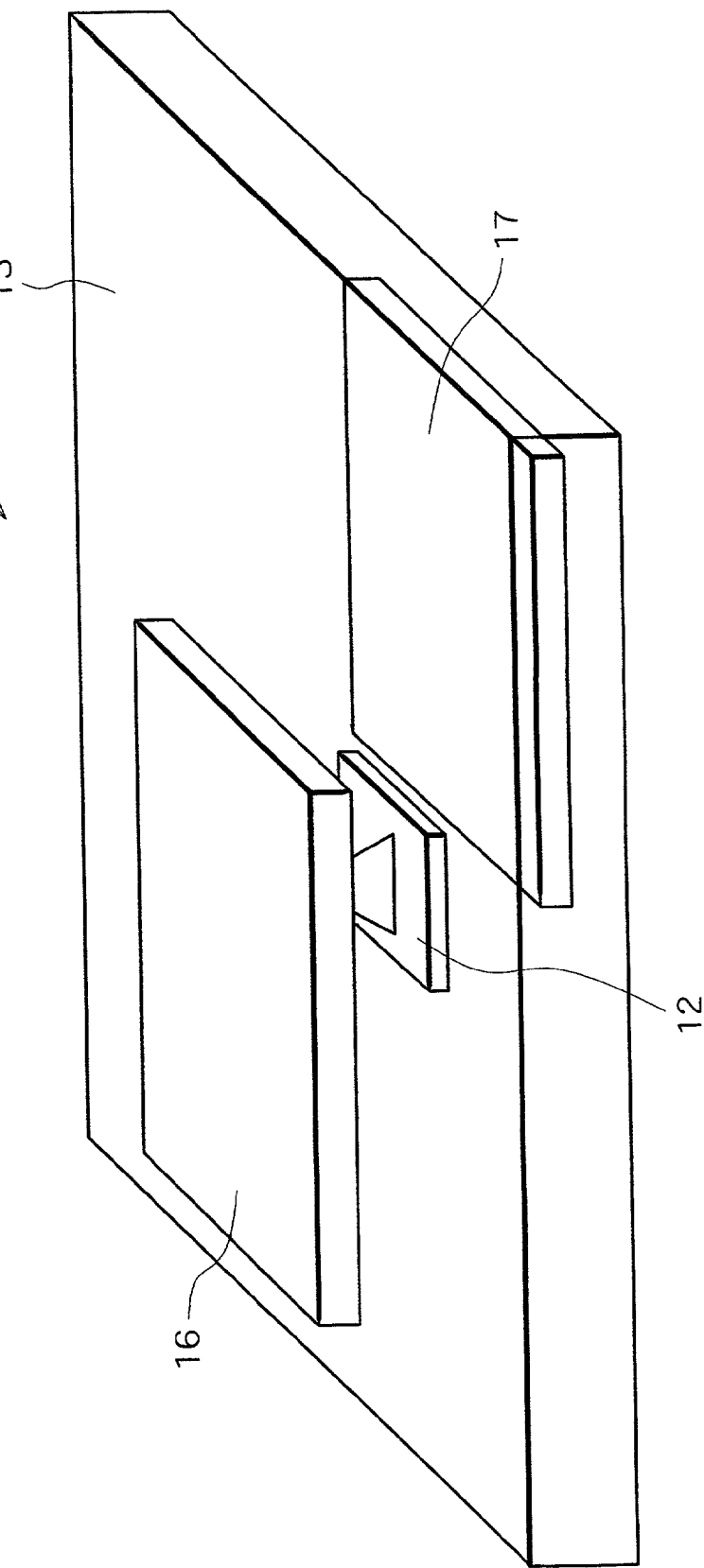

LASER

O₂ PLASMA

DEVICE MOUNTING SUBSTRATE AND METHOD OF REPAIRING DEFECTIVE DEVICE

BACKGROUND OF THE INVENTION

The present invention relates to a device mounting substrate in which a defective device has been repaired with a repair device and a method of repairing the defective device, and to an image display unit using the device mounting substrate and a method of producing the image display unit.

The production of an image display unit by arraying light emitting devices in a matrix to build up the devices into the image display unit has been generally performed by two methods. One method, which is used for producing liquid crystal displays (LCDs) or plasma display panels (PDPs), is carried out by directly forming devices on a substrate. The other method, which is used for producing light emitting diode (LED) displays, is carried out by packaging each LED, and arraying the single LED packages on a substrate. For example, in the case of producing image display units such as LCDs or PDPs, since device isolation is impossible from the viewpoint of the structure thereof, respective devices are generally formed, from the beginning of the production process, in such a manner as to be spaced from each other with a pitch equivalent to a pixel pitch of a final image display unit.

On the other hand, in the case of producing LED displays, LED chips obtained by dicing are individually connected to external electrodes by wire-bonding or bump-connection using flip-chip, to be packaged. In this case, before or after packaging, the LED chips are arrayed with a pitch equivalent to a pixel pitch of a final image display unit; however, such a pixel pitch is independent of the pitch of devices at the time of formation of the devices.

Since LEDs (Light Emitting Diodes) as light emitting devices are expensive, an image display unit using LEDs can be produced at a low cost by producing a number of LEDs from one wafer. To be more specific, the cost of an image display unit can be reduced by preparing LED chips while reducing a size of each LED chip from a conventional size of about 300 μm square into a size of several ten μm square, and connecting the LED chips to each other, to produce the image display unit.

From this viewpoint, there have been known various techniques of transferring devices densely formed on a substrate to a wide region in such a manner that the devices are enlargedly spaced from each other in the wide region, thereby obtaining a relatively large display unit such as an image display unit. For example, U.S. Pat. No. 5,438,241 has disclosed a thin film transfer method, and Japanese Patent Laid-open No. Hei 11-142878 has disclosed a method of forming a transistor array panel for display. In the transfer method disclosed in U.S. Pat. No. 5,438,241, devices densely formed on a substrate are coarsely re-arrayed by transferring the devices densely formed on the substrate to an extensible substrate provided with an adhesive layer, extending the extensible substrate in the X direction and the Y direction while monitoring a device array pitch and positions of respective devices, and transferring the devices on the extended substrate onto a desired display panel. In the technique disclosed in Japanese Patent Laid-open No. Hei 11-142878, thin film transistors forming a liquid crystal display portion on a first substrate are all transferred onto a second substrate, and the thin film transistors are selectively transferred from the second substrate to a third substrate in such a manner that the transferred transistors are spaced from each other on the third substrate with a pitch corresponding to a pixel pitch.

In the case of thin display units such as LCDs and PDPs, as is apparent from characteristics of the production process thereof, a defective (non-activated) pixel inevitably occurs, and such a defective pixel cannot be repaired. Meanwhile, in the case of display units using LEDs as emission sources, since all of the pixels are mounted independently from each other, if a non-activated pixel is detected in an emission test performed after completion of all of the production steps, then such a defective pixel can be repaired, in principle. However, if the defective device is repaired in the usual manner, then the repair requires complicated, microscopic works such as removal of the defective device forcibly fixed, and repair of an insulating layer, and the like.

SUMMARY OF THE INVENTION

An object of the present invention is to provide a device mounting substrate and a method of repairing a defective device, which are capable of easily repairing a defective device without any complicated, microscopic work. Another object of the present invention is to provide an image display unit and a method of producing the image display unit, which are capable of quickly repairing, if a non-activated, defective pixel occurs, the defective pixel.

To achieve the above object, according to a first embodiment of the present invention, there is provided a device mounting substrate including devices arrayed on the substrate in a state being electrically connected to wiring lines, wherein a repair device is mounted to a position corresponding to a position of a defective one of the devices.

According to a second embodiment of the present invention, there is provided a method of repairing a defective device, including the steps of: arraying devices on a substrate and electrically connecting the devices to wiring lines connected to a drive circuit, thereby mounting the devices on the substrate; detecting a defective device; and mounting a repair device at a position corresponding to a position of the defective device.

With the device mounting substrate and the defective device repairing method according to the first and second embodiments of the present invention, a defective device can be repaired by a simple step that is carried out simply mounting and fixing a repair device without removal of the defective device. For example, it is possible to eliminate the need for complicated works such as removal of the mounted devices and selective removal and repair of an insulating layer. Accordingly, a defective device can be repaired not only in the production line but also after shipping of a final product.

According to a third embodiment of the present invention, there is provided an image display unit including light emitting devices arrayed on a substrate in a matrix pattern while being electrically connected to wiring lines, each of the light emitting devices forming a pixel, wherein a light emitting device for repair is mounted at a position corresponding to a position of a defective one of the light emitting devices.

According to a fourth embodiment of the present invention, there is provided a method of producing an image display unit including light emitting devices arrayed on a substrate in a matrix while being electrically connected to wiring lines, each of the light emitting devices forming a pixel. The method includes: a first transfer step of transferring the light emitting devices from a first substrate to a temporary holding member in such a manner that the light emitting devices transferred on the temporary holding member are enlargedly spaced from each other with a pitch larger than a pitch of the light emitting devices arrayed on the first substrate, and holding the light emitting devices on the temporary holding member; a second transfer step of transferring the light emitting devices held on the temporary holding member to a second substrate in such a manner that the light emitting devices transferred on the second substrate are more enlargedly spaced from each other with a pitch larger than the pitch of the light emitting devices held on the temporary holding member; a connection step of electrically connecting the devices, which have been arrayed on the second substrate in such a manner as to be spaced from each other, to wiring lines connected to a drive circuit; a detection step of detecting a defective device; and a repairing step of mounting a light emitting device for repair at a position corresponding to a position of the defective light emitting device.

With the image display unit and its production method according to the third and fourth embodiments of the present invention, an image display potion is formed by re-arraying light emitting devices in such a manner that the devices are enlargedly spaced from each other to be arrayed into a matrix. Accordingly, light emitting devices formed in a dense state, that is, with a high degree of integration by fine processing can be effectively re-arrayed in such a manner that the devices are enlargedly spaced from each other to be arrayed into a matrix. As a result, it is possible to significantly improve the productivity of the image display unit. Also, a non-activated pixel due to a defective light emitting device can be easily repaired, without the need for developing a new process.

Additional features and advantages of the present invention are described in, and will be apparent from, the following Detailed Description of the Invention and the Figures.

BRIEF DESCRIPTION OF THE FIGURES

FIGS. 1A to 1D are schematic views showing a method of arraying devices.

FIG. 2 is a schematic perspective view of a resin-covered chip.

DETAILED DESCRIPTION OF THE INVENTION

Figure 3:
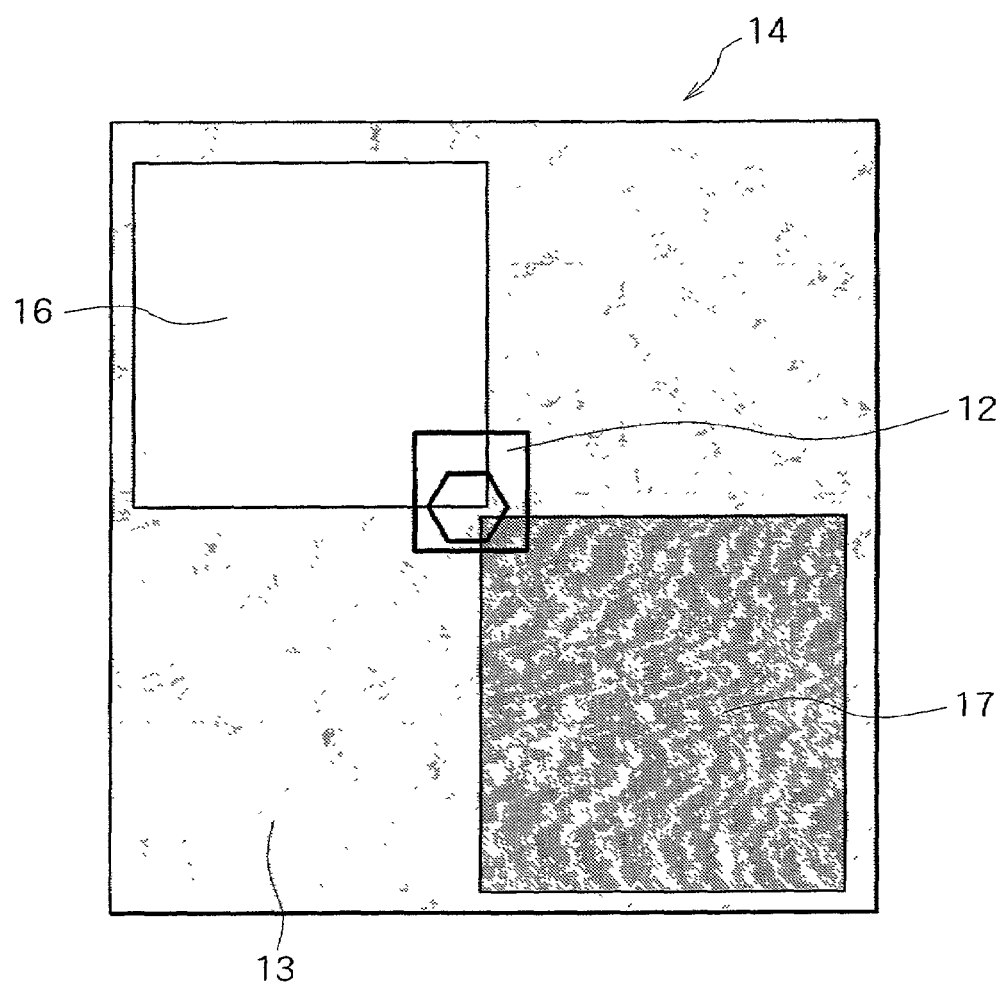
FIG. 3 is a schematic plan view of the resin-covered chip.

Hereinafter, a device mounting substrate and a method of repairing a defective device to which the present invention is applied, and an image display unit and a method of producing the image display unit to which the device mounting substrate and the method of repairing a defective device are applied will be described in detail with reference to the drawings. In addition, the following description will be made by example of an image display unit produced by making use of re-array of devices based on a two-step enlarged transfer method.

First, basic configurations of a method of arraying devices and a method of producing an image display unit, which are based on the two-step enlarged transfer method, will be described. The method of arraying devices and the method of producing an image display unit, which are based on the two-step enlarged transfer method, are carried out by a manner of enlargedly transferring devices formed on a first substrate at a high density onto a temporary holding member in such a manner that the devices held on the temporary holding member are spaced from each other with a pitch larger than a pitch of the devices arrayed on the first substrate, and further enlargedly transferring the devices held on the temporary holding member onto a second substrate in such a manner that the devices mounted on the second substrate are spaced from each other with a pitch larger than the pitch of the devices held on the temporary holding member. It is to be noted that although two-step transfer is used in this embodiment, multi-step transfer such as three or more-step transfer can be used in accordance with a required enlargement ratio between the pitch of the devices arrayed on the first substrate and the pitch of the devices mounted on the second substrate.

FIGS. 1A to 1D show basic steps of the two-step enlarged transfer method. First, devices 12 such as light emitting devices are densely formed on a first substrate 10 shown in FIG. 1A. The number of devices produced per each substrate can be increased by densely forming the devices on the substrate. This is effective to reduce the final production cost. As the first substrate 10, there may be used any kind of substrate insofar as devices can be formed thereon; for example, a semiconductor wafer, a glass substrate, a quartz glass substrate, a sapphire substrate, or a plastic substrate. The devices 12 may be directly formed on the first substrate 10, or may be formed once on another substrate and then arrayed on the first substrate 10.

As shown in FIG. 1B, the devices 12 are transferred from the first substrate 10 to a temporary holding member 11 and are held on the temporary holding member 11. At this time, the devices 12 are selectively transferred on the temporary holding member 11 so as to be arrayed in a matrix as shown in FIG. 1B, wherein the adjacent two of the devices 12 are enlargedly spaced from each other. Specifically, the devices 12 are transferred to the temporary holding member 11 in such a manner as to be enlargedly spaced from each other not only in the X direction but also in the Y direction perpendicular to the X direction. The array pitch of the devices 12 is not particularly limited, but may be set to a value being large enough to easily form a resin portion to each of the devices 12 and easily form electrode pads on the resin portion in the subsequent steps.

After such a first transfer step, as shown in FIG. 1C, each of the devices 12, which are spaced from each other on the temporary holding member 11, is covered with a resin and electrode pads are formed on the resin portion covering the device 12. The covering of the device 12 with a resin is performed to facilitate the formation of the electrode pads for the device 12 and the handling of the device 12 in the subsequent second transfer step. To prevent occurrence of a wiring failure in a final wiring step performed after the second transfer step as will be described later, the electrode pad is formed into a relatively large size. It is to be noted that the electrode pads are not shown in FIG. 1C. A resin-covered chip 14 is formed by forming the electrode pads on each device 12 covered with a resin 13. The device 12 is located at an approximately central portion of the resin-covered chip 14 in a plan view according to this embodiment; however, the device 12 may be located at a position offset to one side or a corner of the resin-covered chip 14.

As shown in FIG. 1D, the second transfer step is carried out. In the second transfer step, the devices 12 in the form of the resin-covered chips 14, which have been arrayed in the matrix on the temporary holding member 11, are transferred to a second substrate 15 in such a manner as to be more enlargedly spaced from each other. Even in this second transfer step, the devices 12 are arrayed in a matrix as shown in FIG. 1D, wherein the adjacent two of the devices 12 are enlarged spaced from each other. Specifically, the devices 12 are transferred in such a manner as to be more enlargedly spaced from each other not only in the X direction but also in the Y direction. If positions of the devices 12 arrayed in the second transfer step correspond to positions of pixels of a final product such as an image display unit, then a pitch of the devices 12 arrayed in the second transfer step is about integer times an original pitch of the devices 12 arrayed on the first substrate 10. Assuming that an enlargement ratio between the pitch of the devices 12 held on the temporary holding member 11 and the pitch of the devices 12 arrayed on the first substrate 10 is taken as "n" and an enlargement ratio between the pitch of the devices 12 arrayed on the second substrate 15 and the pitch of the devices 12 held on the temporary holding member 11 is taken as "m", a value E of the above-described about integer times is expressed by $E = n \times m$.

The devices 12 in the form of the resin-covered chips 14, which are more enlargedly spaced from each other on the second substrate 15, are then subjected to wiring. In this wiring step, care must be taken not to cause a connection failure by making use of the previously formed electrode pads or the like. If the devices 12 are light emitting devices such as light emitting diodes, then the wiring includes wiring to p-electrodes and n-electrodes. If the devices 12 are liquid crystal control devices, the wiring includes wiring to selective signal lines, voltage lines, alignment electrode films, and the like.

In the two-step enlarged transfer shown in FIGS. 1A to 1D, after the first step, the covering of each device 12 with the resin and the formation of the electrode pads on the resin portion covering the device 12 can be performed by making use of the spacing between adjacent two of the devices 12, and after second transfer, wiring can be performed without occurrence of any connection failure by making use of the previously formed electrode pads and the like. It is thus possible to improve the production yield of the image display unit. Also, the two-step enlarged transfer method according to this embodiment has the two steps in each of which the devices are enlargedly spaced from each other. By carrying out such a number of enlarged transfer steps, the number of transfers actually can be reduced. For example, assuming that an enlargement ratio between the pitch of the devices 12 on the temporary holding member 11 and the pitch of the devices 12 on the first substrate 10 is taken as 2 (n=2) and an enlargement ratio between the pitch of the devices 12 on the second substrate 15 and the pitch of the devices 12 on the temporary holding member 11 is taken as 2 (m=2), the total transfer magnification becomes 2×2=4. To achieve the total transfer magnification of 4, according to a one-step transfer method, the number of transfers (alignment) of the devices 12 from the first substrate 10 to the second substrate 15 becomes 16 (=$4^2$) times. On the contrary, to achieve the same total transfer magnification of 4, according to the two-step enlarged transfer method of this embodiment, the number of transfers (alignment) is obtained by adding a square of the enlargement ratio of 2 in the first transfer step (that is, $2^2=4$) to a square of the enlargement ratio of 2 in the second transfer step (that is, $2^2=4$), and therefore, the number of transfer becomes 8 (=4+4). To be more specific, letting the enlargement ratios in the first and second steps be "n" and "m", respectively, according to the two-step enlarged transfer method, to achieve the total transfer magnification of n×m, the total number of transfers becomes ($n^2+m^2$) times; while according to a one-step transfer method, to achieve the same transfer magnification of n×m, the number of transfers becomes $(n+m)^2=n^2+2nm+m^2$. As a result, according to the two-step enlarged transfer method, the number of transfers can be made smaller than that in the one-step transfer method by 2 nm times, thereby correspondingly saving time and cost required for the production step. This becomes more significant as the transfer magnification becomes larger.

In the two-step enlarged transfer method shown in FIGS. 1A to 1D, the device 12 is configured as a light emitting device; however, the device 12 is not limited thereto but may be a device selected from a liquid crystal control device, a photoelectric transfer device, a piezoelectric device, a thin film transistor device, a thin film diode device, a resistance device, a switching device, a micro-magnetic device, and a micro-optical device, or part of the device, or a combination thereof.

In the second transfer step, the device (typically, light emitting device) 12 is treated as the resin-covered chip 14, and is transferred from the temporary holding member 11 to the second substrate 15. The resin-covered chip 14 will be described below with reference to FIGS. 2 and 3. The resin-covered chip 14 is formed by covering each of the devices 12, which are spaced from each other, with the resin 13. The device 12 is transferred, in the form of the resin-covered chip 14, from the temporary holding member 11 to the second substrate 15. The resin-covered chip 14 is formed into an approximately flat plate shape having an approximately square shaped principal plane. The shape of the resin-covered chip 14 is equivalent to the shape of the resin 13 covering the device 12. Concretely, the resin-covered chips 14 are produced by a manner of coating the entire surface of the temporary holding member 11 with a non-cured resin so as to cover the devices 12 therewith, curing the resin, and cutting the cured resin into square shapes by dicing.

Electrode pads 16 and 17 are formed on front and back surfaces of the approximately flat shaped resin 13 of the resin-covered chip 14, respectively. These electrode pads 16 and 17 are produced by forming a conductive layer made from a metal or polysilicon as a material of the electrode pads 16 and 17 overall on the surface of the resin 13, and patterning the conductive layer into specific electrode shapes by a photolithography technique. These electrode pads 16 and 17 are formed so as to be connected to a p-electrode and an n-electrode of the device 12, and a via-hole and the like are formed in the resin 13 as needed.

In the example shown in FIG. 2, the electrode pads 16 and 17 are formed on the front and back surfaces of the resin-covered chip 14, respectively; however, the present invention is not limited thereto. For example, the electrodes 16 and 17 may be formed on either the front surface or the back surface of the resin-covered chip 14. Further, if the device 12 is a thin film transistor, then three or more electrode pads may be formed because three electrodes, that is, a source electrode, a gate electrode, and a drain electrode are provided. The reason why the electrode pads 16 and 17 are offset from each other in the horizontal direction is to prevent the electrode pads 16 and 17 from being overlapped to each other in the case of forming a contact hole from above at the time of forming final wiring. The shape of each of the electrode pads 16 and 17 is not limited to a square shape but may be any other shape.

Since the resin-covered chip 14 formed by covering the device 12 with the resin 13 is flattened, the electrode pads 16 and 17 can be accurately formed on the flattened surfaces of the resin 13 of the resin-covered chip 14 in such a manner as to extend to a region wider than the size of the device 12, to thereby facilitate the handling of the resin-covered chip 14 at the time of transfer using an attracting jig in the second transfer step. As will be described later, since final wiring is performed after the second transfer step, a wiring failure can be prevented by wiring using the electrode pads 16 and 17 having relatively large sizes.

Figure 4A:
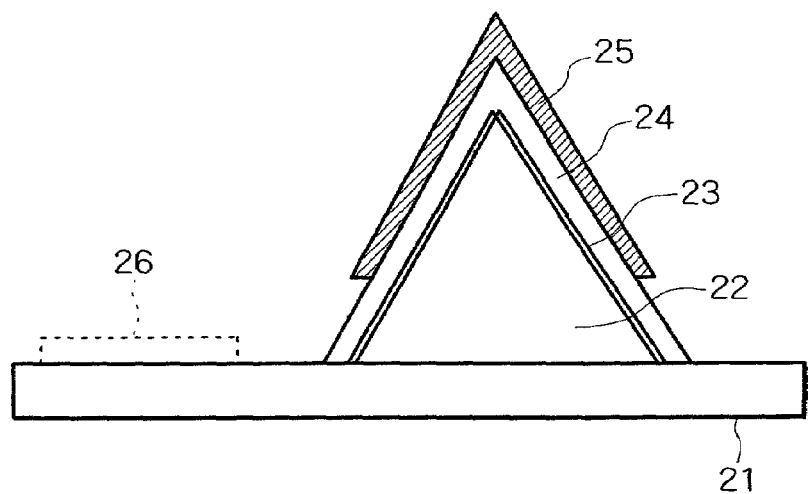
FIGS. 4A and 4B are a sectional view and a plan view of one example of a light emitting device, respectively.
Figure 4B:
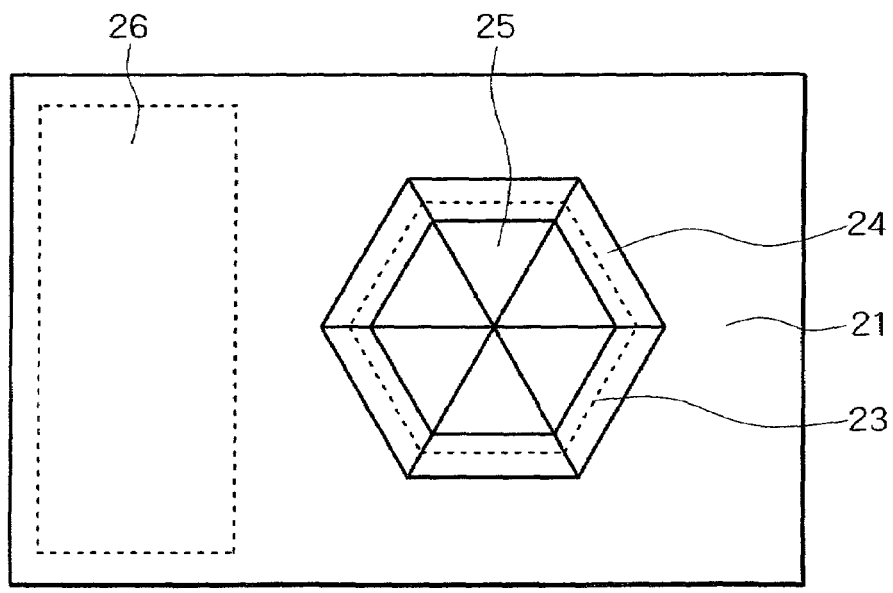

FIGS. 4A and 4B show a structure of a light emitting device as one example of the device used in the two-step enlarged transfer method according to this embodiment, wherein FIG. 4A is a sectional view of the device and FIG. 4B is a plan view of the device. The light emitting device shown in the figure is a GaN based light emitting diode that is formed, typically, on a sapphire substrate by crystal growth. In this GaN based light emitting diode, laser abrasion occurs by irradiation of the device with a laser beam passing through the substrate, to generate a phenomenon in which nitrogen of GaN is evaporated, thereby causing film peeling at an interface between the sapphire substrate and a GaN based growth layer, with a result that device peeling easily can be performed.

The GaN based light emitting diode is configured such that a hexagonal pyramid shaped GaN layer 22 is formed by selective growth on an under growth layer 21 composed of a GaN based semiconductor layer. While not shown, an insulating film is formed on the under growth layer 21, and the hexagonal pyramid shaped GaN layer 22 is formed from an opening formed in the insulating film by a MOCVD process or the like. The GaN layer 22 is a growth layer formed into a pyramid shape covered with an S-plane; that is, (1-101) plane when a principal plane of a sapphire substrate used at the time of growth is taken as a C-plane. The GaN layer 22 is a region doped with silicon. The tilt S-plane portion of the GaN layer 22 functions as a cladding portion of a double-hetero structure. An InGaN layer 23 functioning as an active layer is formed in such a manner as to cover the tilt S-plane of the GaN layer 22. A GaN layer 24 doped with magnesium is formed on the InGaN layer 23. The GaN layer 24 doped with magnesium also functions as a cladding portion.

The light emitting diode has a p-electrode 25 and an n-electrode 26. A metal material such as Ni/Pt/Au or Ni(Pd)/Pt/Au is vapor-deposited on the GaN layer 24 doped with magnesium, to form the p-electrode 25. A metal material such as Ti/Al/Pt/Au is vapor-deposited in an opening formed in the above-described insulating film (not shown), to form the n-electrode 26. In the case of extracting an n-electrode from a back surface side of the under growth layer 21, it is not required to form the n-electrode 26 on the front surface side of the under growth layer 21.

The GaN based light emitting diode having such a structure enables light emission of blue. In particular, such a light emitting diode can be relatively simply peeled from the sapphire substrate by laser abrasion. In other words, the diode can be selectively peeled by selective irradiation of a laser beam. The GaN based light emitting diode may be configured such that an active layer is formed in a planar or strip shape, or may be configured to have a pyramid structure in which a C-plane is formed on an upper end portion of the pyramid. The GaN light emitting diode may be replaced with any other nitride based light emitting device or a compound semiconductor device.

Figure 5:
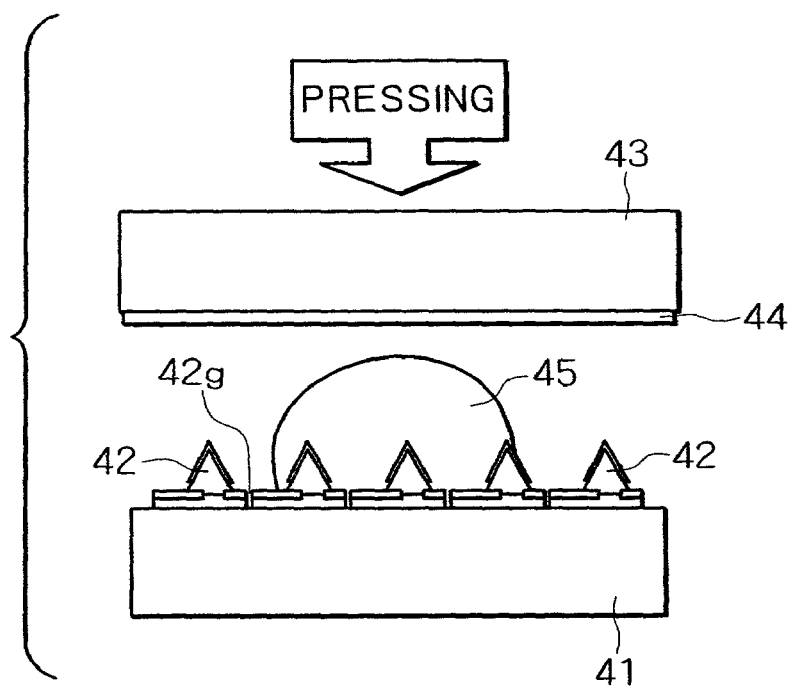
FIG. 5 is a schematic sectional view showing a step of pressing a first temporary holding member to a first substrate.

A concrete method of producing an image display unit by making use of the method of arraying light emitting devices shown in FIGS. 1A to 1D will be described below. As the light emitting device, the GaN based light emitting diode shown in FIGS. 4A and 4B is used. First, as shown in FIG. 5, a number of light emitting diodes 42 are densely formed on a principal plane of a first substrate 41. The size of the light emitting diode 42 can be made as fine as about 20 μm square. The first substrate 41 is made from a material having a high permeability against a wavelength of a laser beam used for irradiating the light emitting diode 42; for example, sapphire. The light emitting diode 42 is already provided with a p-electrode and the like but is not subjected to final wiring. Grooves 42g for device isolation are formed to allow the light emitting diodes 42 to be isolated from each other. The grooves 42g are formed, for example, by reactive ion etching.

The light emitting diodes 42 on the first substrate 41 are then transferred to a first temporary holding member 43. The first temporary holding member 43 is exemplified by a glass member, a quartz glass member, or a plastic member, and in this embodiment, it is represented by a quartz glass member. A release layer 44 functioning as a release layer is formed on a surface of the first temporary holding member 43. As the release layer 44, there can be used a fluorine coat layer, a silicon resin layer, a water-soluble adhesive (for example, PVA) layer, or a polyimide layer. In this embodiment, a polyimide layer is used as the release layer 44.

Figure 6:
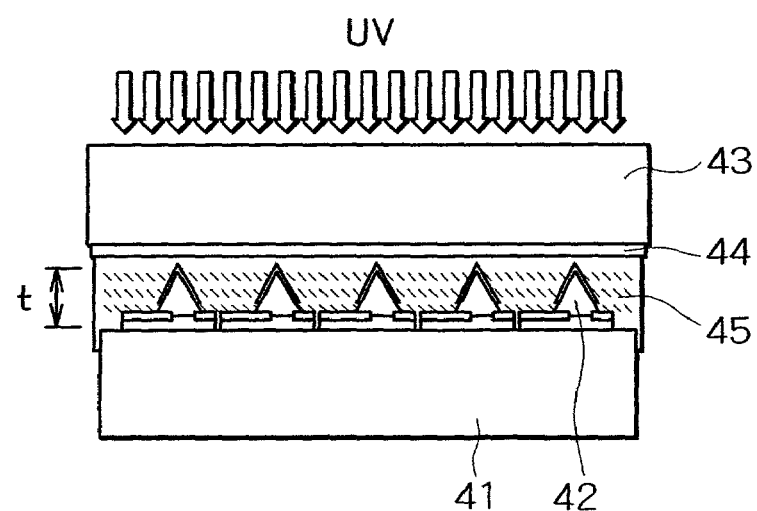
FIG. 6 is a schematic sectional view showing a step of curing an UV-curing type adhesive.

Before transfer, as shown in FIG. 5, the first substrate 41 is coated with an adhesive (for example, ultraviolet ray curing type adhesive) 45 in an amount sufficient to cover the light emitting diodes 42, and the first temporary holding member 43 is overlapped to the first substrate 41 in such a manner as to be supported by the light emitting diodes 42. In such a state, as shown in FIG. 6, the adhesive 45 is irradiated, from the back side of the first temporary holding member 43, with ultraviolet rays (UV), to be thereby cured. Since the first temporary holding member 43 is made from quartz glass, the ultraviolet rays pass through the first temporary holding member 43, to quickly cure the adhesive 45.

At this time, since the first temporary holding member 43 is supported by the light emitting diodes 42, a gap between the first substrate 41 and the first temporary holding member 43 is determined by a height of the light emitting diodes 42. When the adhesive 45 is cured, as shown in FIG. 6, in the state that the first temporary holding member 43 is overlapped to the first substrate 41 in such a manner as to be supported by the light emitting diodes 42, a thickness "t" of the adhesive 45 is determined by the gap between the first substrate 41 and the first temporary holding member 43 and accordingly determined by the height of the light emitting diodes 42. In other words, the light emitting diodes 42 on the first substrate 41 serve as a spacer allowing formation of the adhesive layer having a specific thickness between the first substrate 41 and the first temporary holding member 43. According to this embodiment, since the thickness of the adhesive layer is determined by the height of the light emitting diodes 42 as described above, it is possible to form the adhesive layer having a specific thickness without strictly controlling a pressure applied to the adhesive 45.

Figure 7:
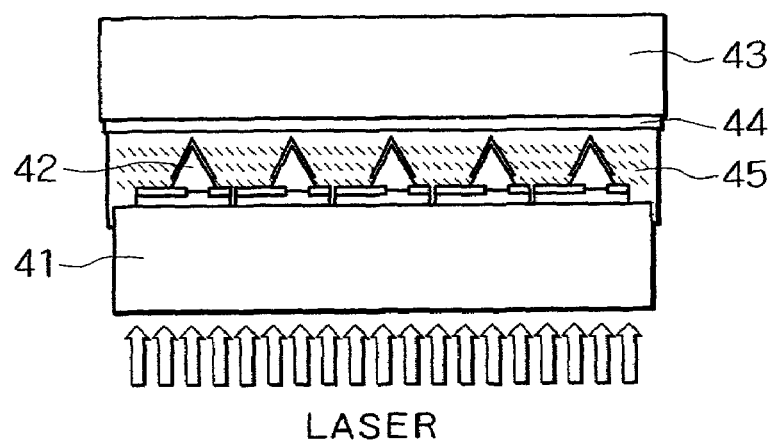
FIG. 7 is a schematic sectional view showing a step of causing laser abrasion.

After the adhesive 45 is cured, as shown in FIG. 7, the light emitting diodes 42 are irradiated with laser beams from a back surface of the first substrate 41, to be peeled from the first substrate 41 by making use of laser abrasion. Since the GaN based light emitting diode 42 is decomposed into gallium (Ga) and nitrogen at an interface between the GaN layer and sapphire, the light emitting diode 42 can be relatively simply peeled. As the laser beam used for irradiation of the light emitting device 42, an excimer laser beam or a harmonic YAG laser beam is used. The light emitting diodes 42 are thus peeled from the first substrate 41 at the interface between the GaN layer and the first substrate 41 by laser abrasion, and are transferred to the first temporary holding member 43 in a state being buried in the adhesive 45.

Figure 8:
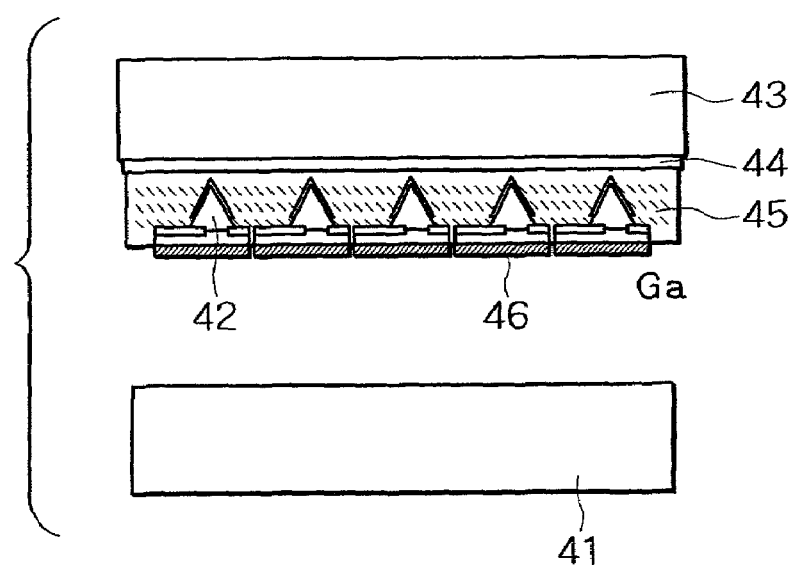
FIG. 8 is a schematic sectional view showing a step of separating the first substrate from the first temporary holding member.
Figure 9:
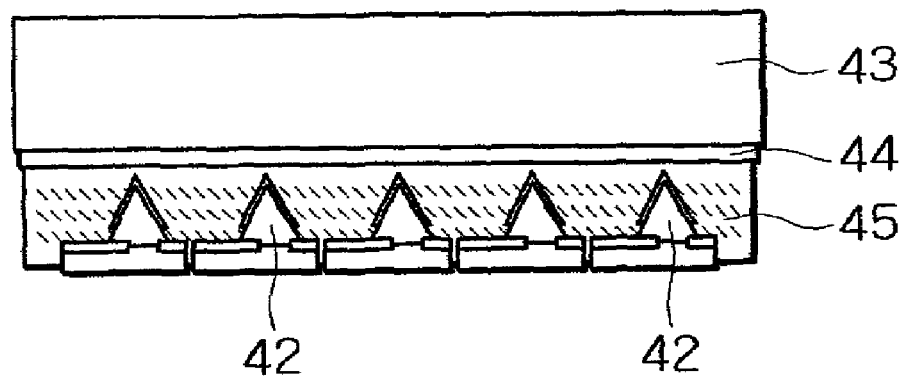
FIG. 9 is a schematic sectional view showing a step of removing gallium.
Figure 10:
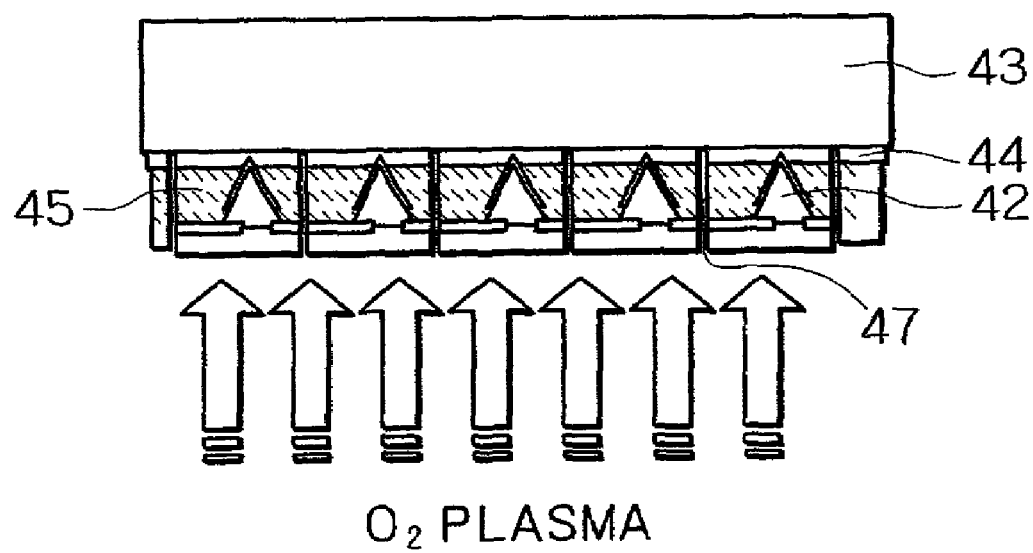
FIG. 10 is a schematic sectional view showing a step of forming device isolation grooves.

FIG. 8 shows a state that the first substrate 41 is removed by the above-described peeling. At this time, since the GaN based light emitting diodes 42 are peeled from the first substrate 41 made from sapphire by laser abrasion, gallium (Ga) 46 is precipitated on the peeled plane. Such deposited gallium (Ga) must be removed by etching. Concretely, as shown in FIG. 9, gallium (Ga) 46 is removed by wet etching using a water solution containing NaOH or diluted nitric acid. Subsequently, the peeled plane is further cleaned by oxygen plasma ($O_2$ plasma), and dicing grooves 47 are formed in the adhesive 45 by dicing, to isolate the light emitting diodes 42 from each other. The light emitting diodes 42 are then selectively separated from the first temporary holding member 43. The dicing process can be performed by a usual blade. Alternatively, if a narrow cut-in-depth of about 20 μm or less is required, laser cutting may be performed. The cut-in-depth is dependent on a size of the light emitting diode 42 covered with the adhesive 45 within a pixel of an image display unit. As one example, the grooves are formed by irradiation of an excimer laser beam, to form a shape of each chip.

Figure 11:
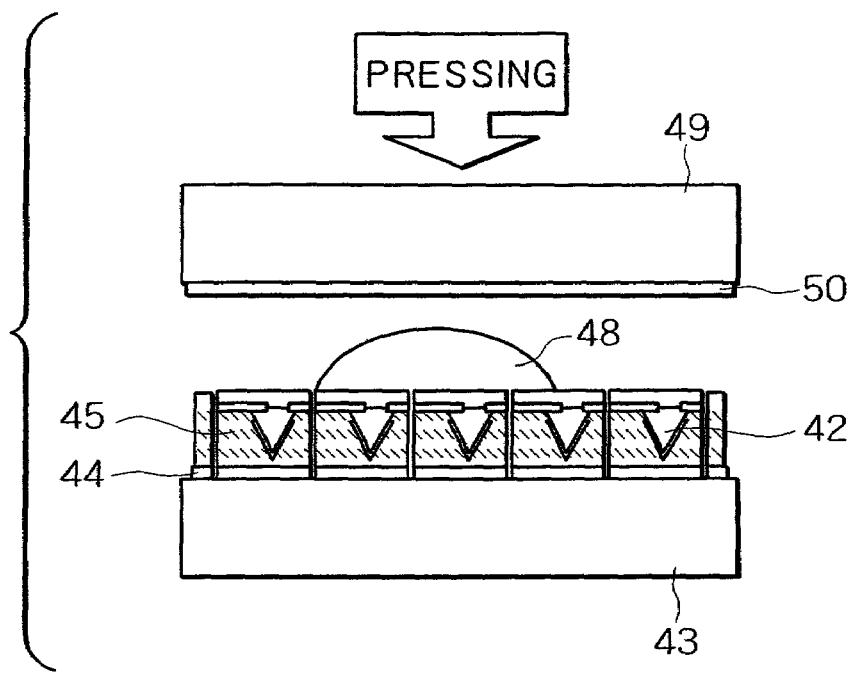
FIG. 11 is a schematic sectional view showing a step of pressing a second temporary holding member to the first substrate.

The selective separation of the light emitting diodes 42 is performed as follows. First, as shown in FIG. 11, the cleaned light emitting diodes 42 are coated with a UV adhesive 48, and a second temporary holding member 49 is overlapped to the adhesive 48. Like the first temporary holding member 43, the second temporary holding member 49 may be configured as a glass member, a quartz glass member, or a plastic member. In this embodiment, a quartz glass member is used as the second temporary holding member 49. A release layer 50 made from polyimide is also formed on a surface of the second temporary holding member 49.

Figure 12:
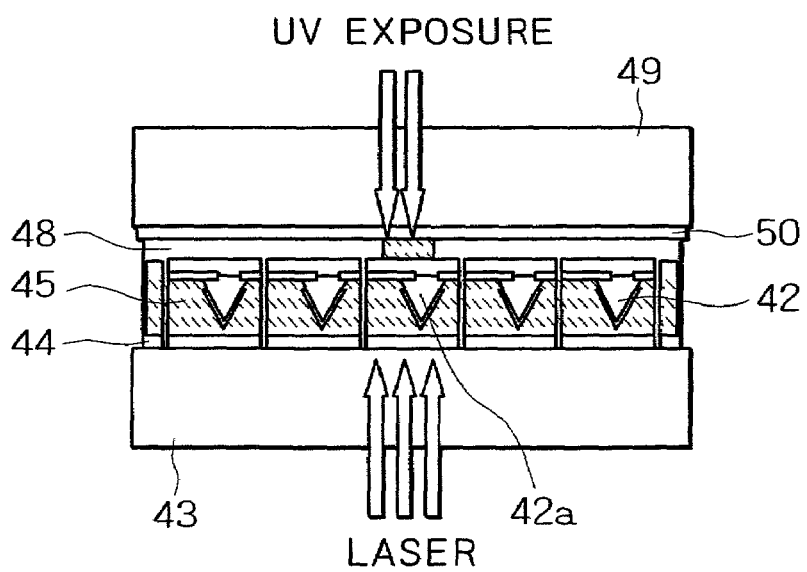
FIG. 12 is a schematic sectional view showing a step of performing selective laser abrasion and UV exposure.
Figure 13:
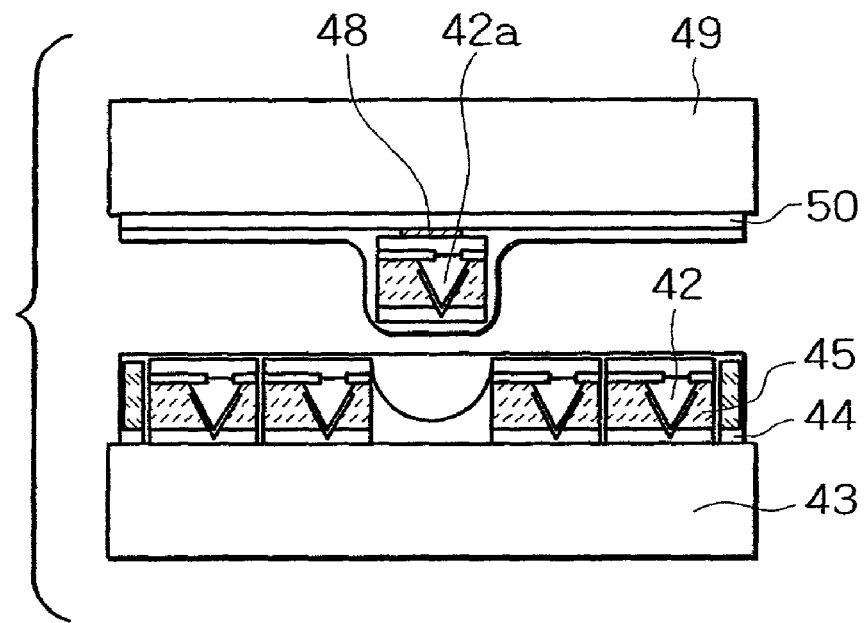
FIG. 13 is a schematic sectional view showing a step of selectively separating a light emitting diode.

As shown in FIG. 12, only a portion, corresponding to a light emitting diode 42a to be transferred, of the first temporary holding member 43 is irradiated, from a back side of the first temporary holding member 43, with laser, to peel the light emitting diode 42a from the first temporary holding member 43 by laser abrasion. At the same time, a portion, corresponding to the light emitting diode 42a to be transferred, of the second temporary holding member 49 is irradiated, from a back side of the second temporary holding member 49, with visual or infrared laser rays, to temporary melt and cure the irradiated portion of the UV adhesive 48. As a result, when the second temporary holding member 49 is peeled from the first temporary holding member 43, only the light emitting diode 42a to be transferred is selectively separated from the first temporary holding member 43 as shown in FIG. 13 and is transferred to the second temporary holding member 49.

Figure 14:
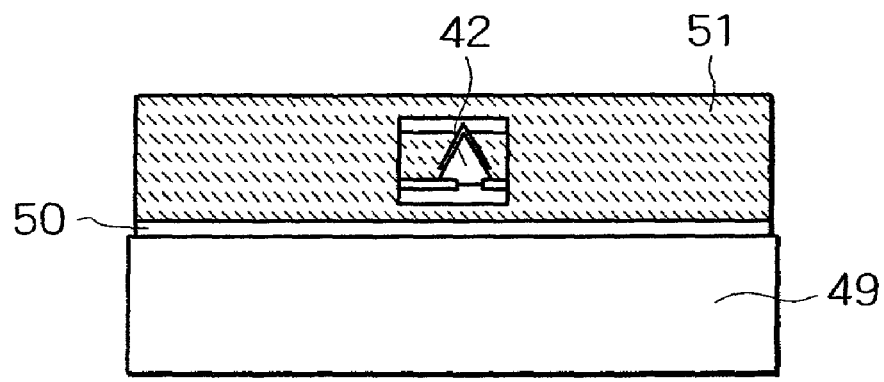
FIG. 14 is a schematic sectional view showing a step of burying the light emitting diode in a resin.
Figure 15:
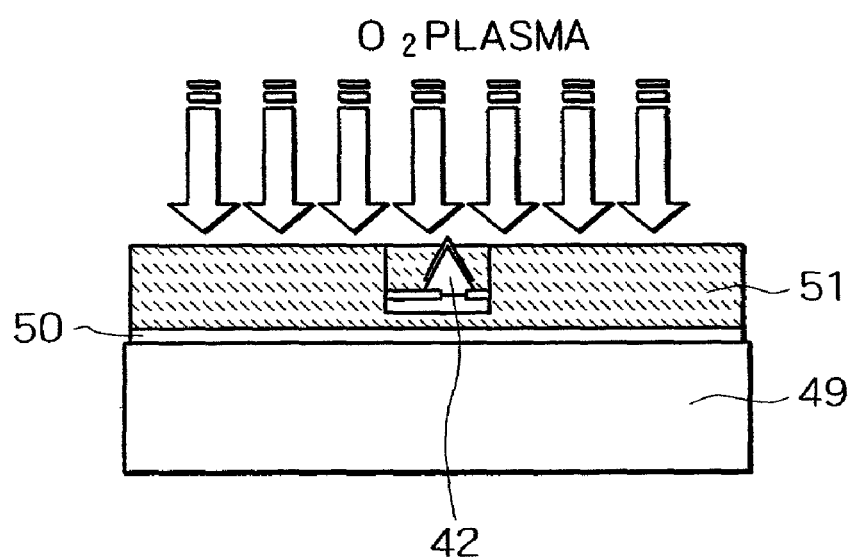
FIG. 15 is a schematic sectional view showing a step of reducing a thickness of a resin layer.
Figure 16:
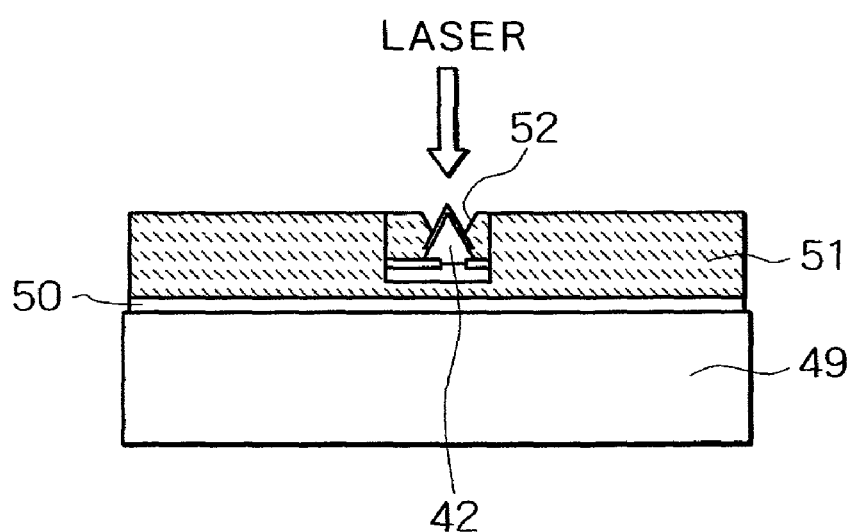
FIG. 16 is a schematic sectional view showing a step of forming a via-hole.

After selective separation, as shown in FIG. 14, a resin is applied to cover the transferred light emitting diode 42, to form a resin layer 51. Subsequently, as shown in FIG. 15, a thickness of the resin layer 51 is reduced by oxygen plasma or the like until an upper surface of the light emitting diode 42 is exposed, and as shown in FIG. 16, a via-hole 52 is formed at a portion, corresponding to the light emitting diode 42, of the resin layer 51 by laser irradiation. The formation of the via-hole 52 may be performed by irradiation of an excimer laser beam, a harmonic YAG laser beam, or a carbon diode laser beam. A diameter of the via-hole 52 is typically set to a value ranging from about 3 to 7 µm.

Figure 17:
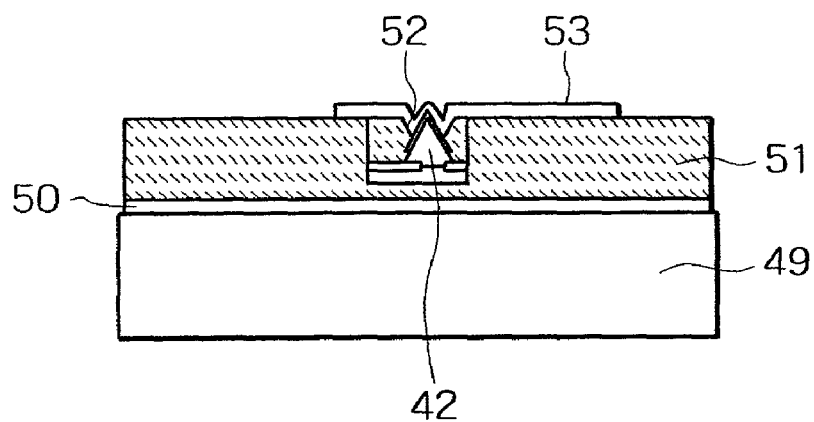
FIG. 17 is a schematic sectional view showing a step of forming an anode side electrode pad.

An anode side electrode pad 53 to be connected to a p-electrode of the light emitting diode 42 is formed through the via-hole 52. The anode side electrode pad 53 is typically made from Ni/Pt/Au. FIG. 17 shows a state that after the light emitting diode 42 is transferred to the second temporary holding member 49, the anode electrode (p-electrode) side via-hole 52 is formed and then the anode side electrode pad 53 is formed.

Figure 18:
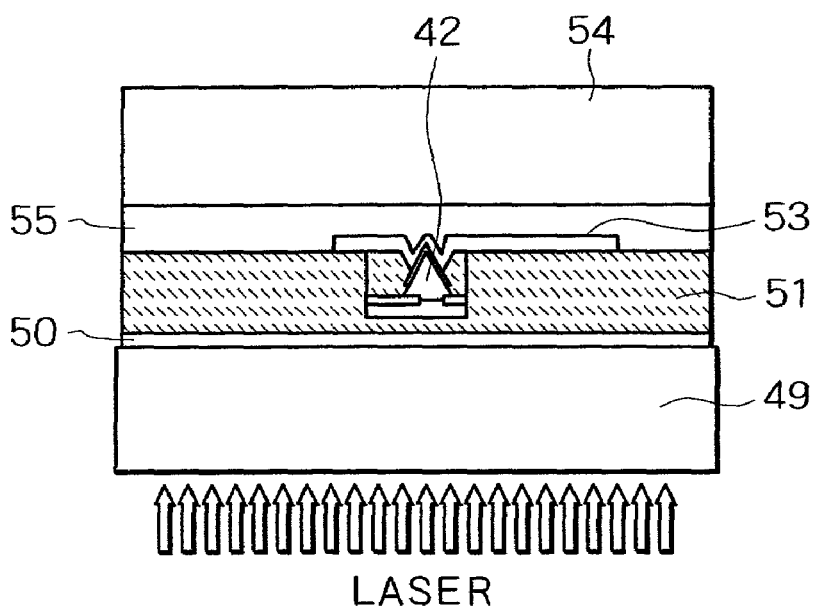
FIG. 18 is a schematic sectional view showing a step of causing laser abrasion.
Figure 19:
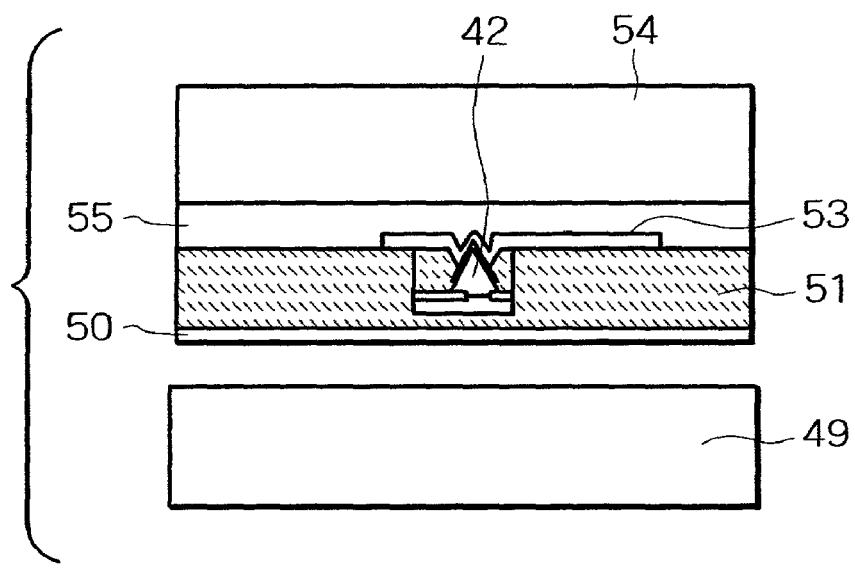
FIG. 19 is a schematic sectional view showing a step of separating the first substrate from the second temporary holding member.

After the anode side electrode pad 53 is formed, the light emitting diode 42 is transferred to a third temporary holding member 54 for forming a cathode side electrode on a surface, opposed to the anode side electrode pad 53, of the light emitting diode 42. The third temporary holding member 54 is typically made from quartz glass. Before transfer, as shown in FIG. 18, an adhesive 55 is applied to cover the light emitting diode 42 provided with the anode side electrode pad 53 and the resin layer 51, and then the third temporary holding member 54 is stuck on the adhesive 55. In such a state, laser irradiation is performed from a back side of the second temporary holding member 49. With this laser irradiation, peeling by laser abrasion occurs at an interface between the second temporary holding member 49 made from quartz glass and the release layer 50 made from polyimide on the second temporary holding member 49. As a result, the light emitting diode 42 and the resin layer 51, which have been formed on the release layer 260, are transferred to the third temporary holding member 54. FIG. 19 shows a state that the second temporary holding member 49 is separated.

Figure 20:
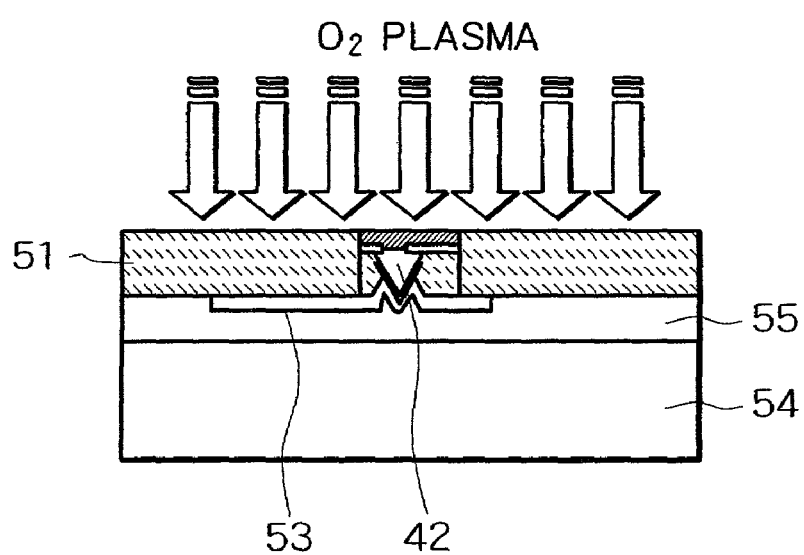
FIG. 20 is a schematic sectional view showing a step of exposing a contact semiconductor layer.
Figure 21:
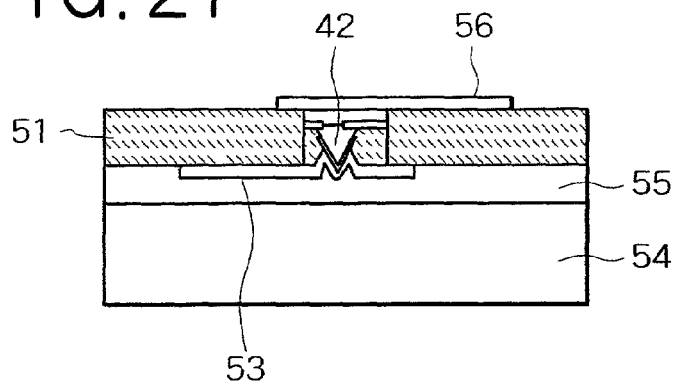
FIG. 21 is a schematic sectional view showing a step of forming a cathode side electrode pad.

The formation of the cathode side electrode will be performed as follows. After the above-described transfer step, as shown in FIG. 20, the release layer 50 and the excess resin layer 51 are removed by $O_2$ plasma until a contact semiconductor layer (n-electrode) of the light emitting diode 42 is exposed. In the state that the light emitting diode 42 is held by the adhesive 55 of the third temporary holding member 54, a back side of the light emitting diode 42 is taken as the n-electrode side (cathode electrode side). As shown in FIG. 21, an electrode pad 56 is formed so as to be electrically connected to the back surface of the light emitting diode 42. The electrode pad 56 is then patterned. At this time, a size of the cathode side electrode pad is typically set to about 60 µm square. As the electrode pad 56, there may be used a transparent electrode (ITO or ZnO based electrode) or a Ti/Al/Pt/Au electrode. In the case of using the transparent electrode, even if the electrode covers a large area of the light emitting diode 42, it does not block light emission, and accordingly, the size of the electrode can be increased with a rough patterning accuracy, to facilitate the patterning process.

Figure 22:
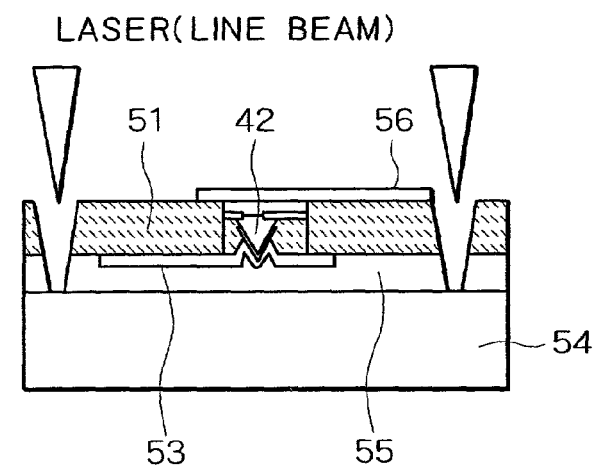
FIG. 22 is a schematic sectional view showing a step of performing laser dicing.

The light emitting diode 42 buried in the resin layer 51 and the adhesive 55 is then isolated in the form of a resin-covered chip by cutting; typically, laser dicing. FIG. 22 shows the step of isolating the light emitting diode 42 by laser dicing. The laser dicing is performed by using a laser line beam so as to cut the resin layer 51 and the adhesive 55 until the third temporary holding member 54 is exposed. Each light emitting diode 42 is isolated in the form a resin-covered chip having a specific size by laser dicing, and is carried to a mounting step to be described later.

Figure 23:
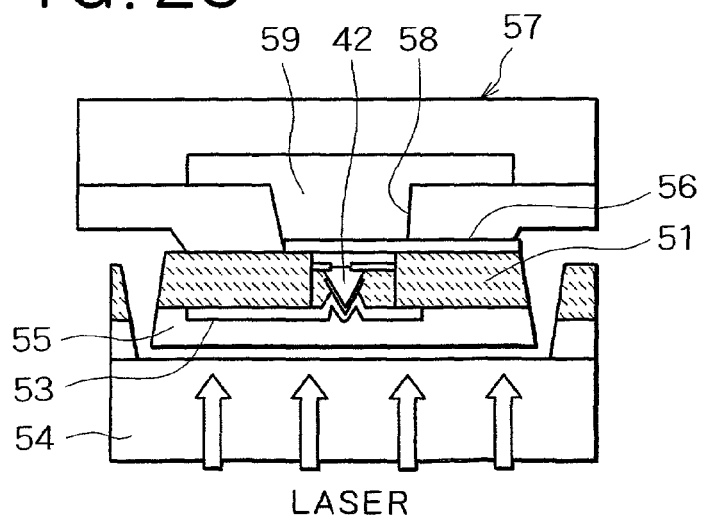
FIG. 23 is a schematic sectional view showing a step of selectively picking up the light emitting diode by an attracting jig.

In the mounting step, the light emitting diode 42 in the form of the resin-covered chip is peeled from the third temporary holding member 54 by combination of mechanical parts (parts for attracting the device by vacuum suction) and laser abrasion. FIG. 23 shows a state that one of the light emitting diodes 42 arrayed on the third temporary holding member 54 is picked up by an attracting device 57. The attracting device 57 has attracting holes 58 opened in a matrix corresponding to a pixel pitch of an image display unit in order to collectively attract a number of the light emitting diodes 42. The attracting holes 58, each having an opening diameter of about 100 µm, are arranged in a matrix with a pitch of 600 µm. Accordingly, the attracting device 57 can collectively attract 300 pieces of the light emitting diodes 42. A member in which the attracting holes 58 are to be formed may be produced from Ni by electrocasting, or formed of a plate made from a metal such as a stainless steel (SUS), and the attracting holes 58 are formed in the member by etching. An attracting chamber 59 is formed at the depth of the attracting hole 58. The control of the pressure in the attracting chamber 59 into a negative pressure allows the attracting device 57 to attract the light emitting diode 42. Since each light emitting diode 42 is in a state being covered with the adhesive layer 51 whose surface is nearly flatted, the selective attraction of the light emitting device 42 by the attracting device 57 can be facilitated.

The peeling of the light emitting diode 42 can be smoothly performed by combination of the attraction of the device 42 by the attracting device 57 and peeling of the resin-covered chip by laser abrasion. The laser abrasion is performed by irradiation of a laser beam from a back side of the third temporary holding member 54, to cause peeling at an interface between the third temporary holding member 54 and the adhesive 55.

Figure 24:
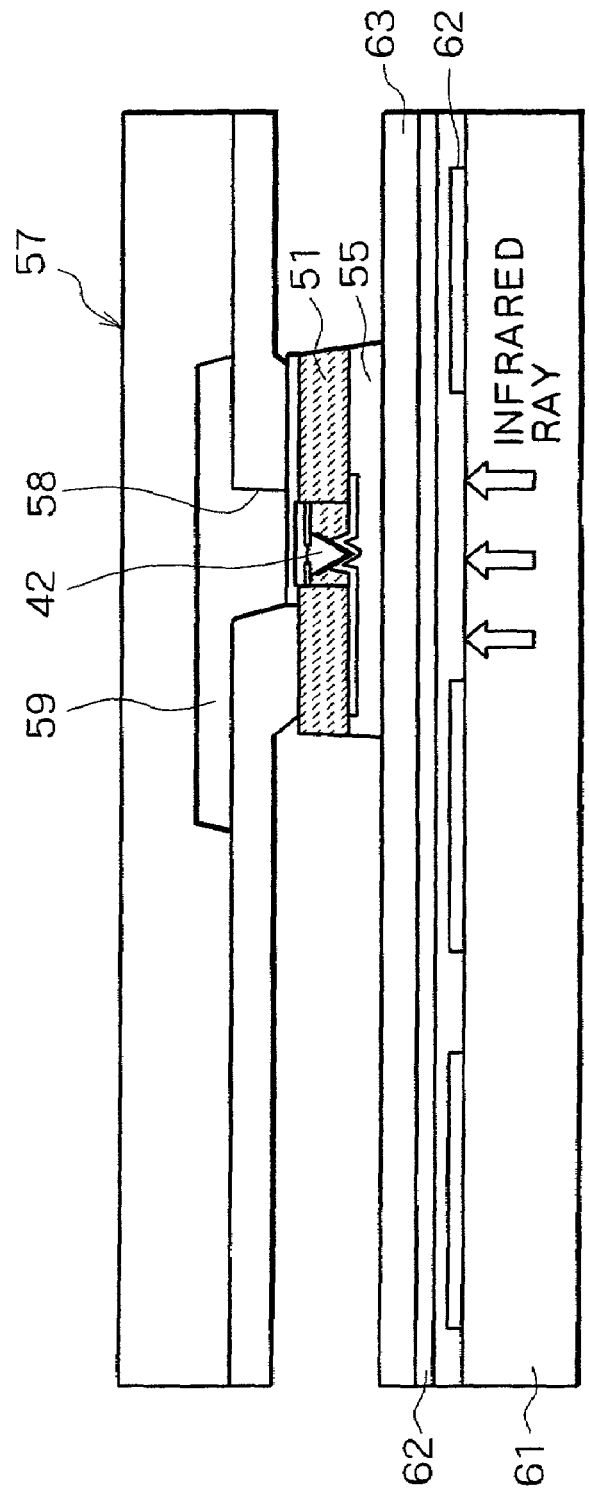
FIG. 24 is a schematic sectional view showing a step of transferring the light emitting diode to a second substrate.

FIG. 24 is a view showing a state that the light emitting diode 42 is transferred to a second substrate 61. The second substrate 61 is a wiring substrate having a wiring layer 62. An adhesive layer 63 is previously formed on the second substrate 61 for mounting the light emitting diode 42 on the second substrate 61. By curing a portion, corresponding to the light emitting diode 42, of the adhesive layer 63, the light emitting diode 42 can be fixedly arrayed on the second substrate 62. At the time of this mounting, the pressure of the attracting chamber 59 of the attracting device 57 becomes high, to release the attraction of the light emitting diode 42 to the attracting device 57. The adhesive layer 63 is made from a UV-curing type adhesive, a thermosetting adhesive, or a thermoplastic adhesive. In addition, the light emitting diodes 42 thus arrayed on the second substrate 61 are spaced from each other with a pitch larger than a pitch of the light emitting diodes 42 held on the third temporary holding member 54. An energy for curing the resin of the adhesive layer 63 is given from the back side of the second substrate 61. A portion, corresponding to the light emitting diode 42, of the adhesive layer 63 may be cured by irradiation of ultraviolet rays if the adhesive layer 63 is made from an UV-curing type adhesive, and may be cured by heating with the aid of infrared rays if the adhesive layer 63 is made from a thermosetting adhesive. Alternatively, if the adhesive layer 63 is made from a thermoplastic adhesive, then the adhesive is melted by irradiation of infrared rays or a laser beam, to bond the light emitting diode 42 thereto.

Figure 25:
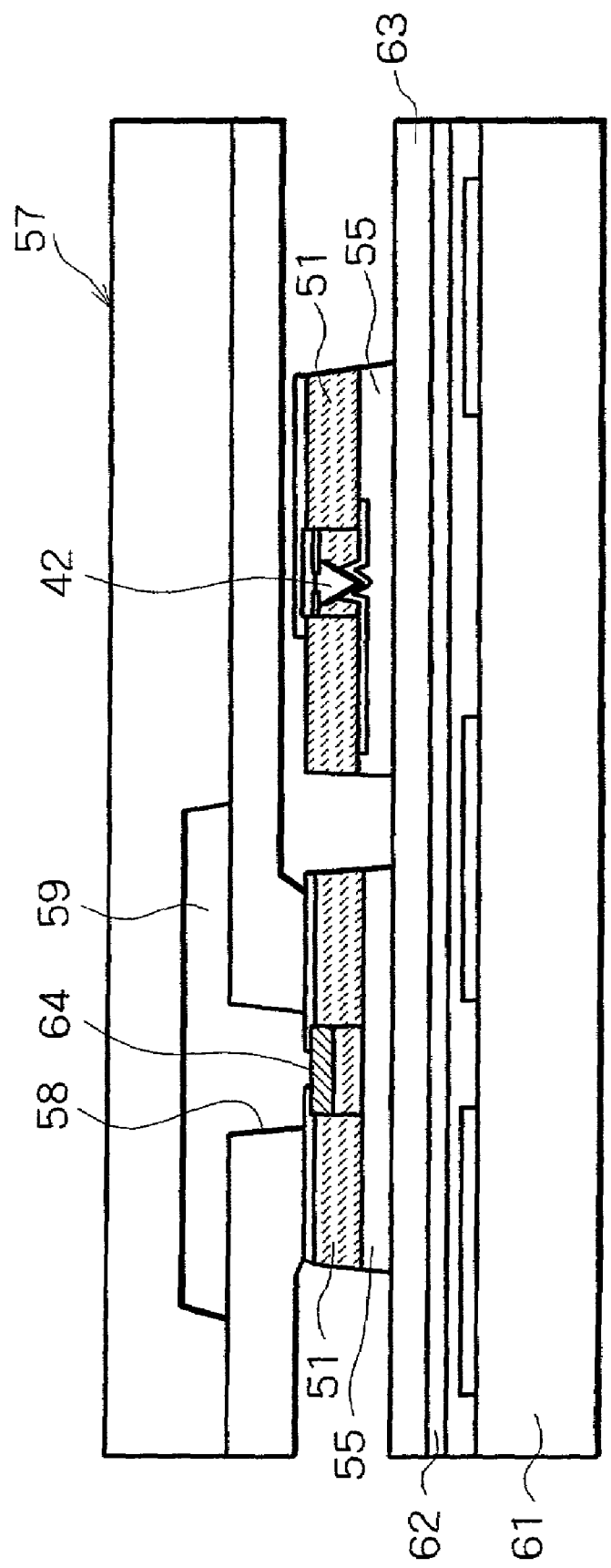
FIG. 25 is a schematic sectional view showing a step of transferring another light emitting diode.

FIG. 25 is a view showing a process of arraying a light emitting diode 64 for another color on the second substrate 61. By mounting the light emitting diodes of a number of colors on the second substrate 61 at respective positions corresponding to the colors via the attracting device 57 shown in FIG. 23, a pixel composed of the light emitting diodes of the number of colors can be formed with a pixel pitch fixed. The shapes of the light emitting diodes 42 and 64 are not necessarily identical to each other. In the example shown in FIG. 25, the red light emitting diode 64 has a planar structure including no hexagonal pyramid shaped GaN layer and is different in shape from the other light emitting diode 42; however, in this stage, each of the light emitting diodes 42 and 64 has been already covered with the resin layer 51 and the adhesive 55 to be thus formed into a resin-covered chip, and therefore, the light emitting diodes 42 and 64 can be handled in the same manner irrespective of the difference in device structure therebetween.

Figure 26:
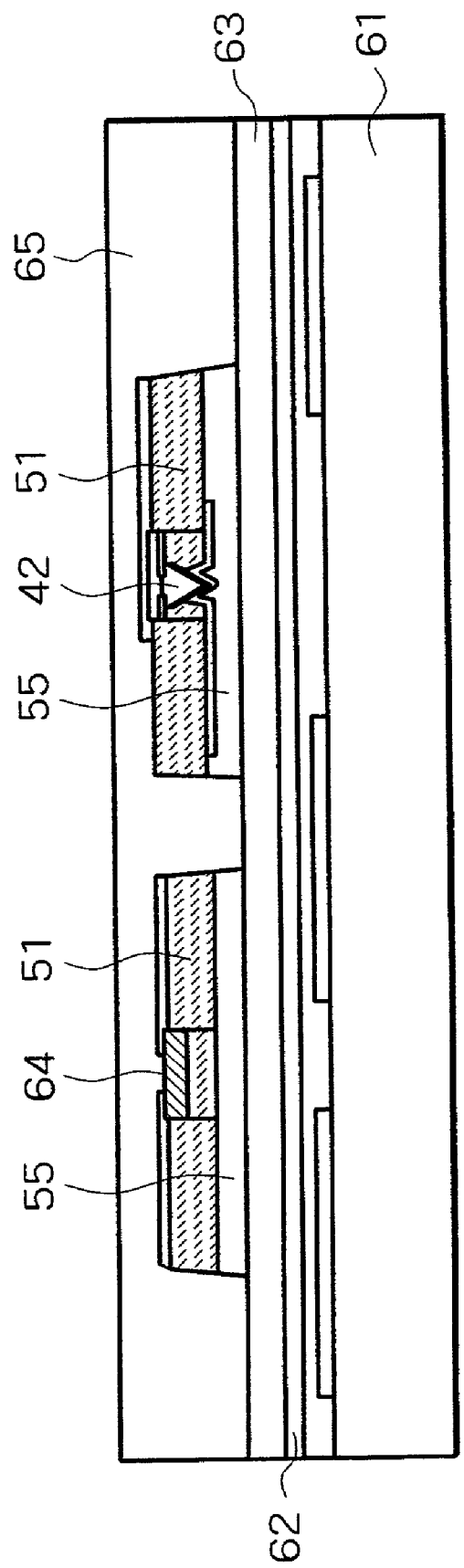
FIG. 26 is a schematic sectional view showing a step of forming an insulating layer.
Figure 27:
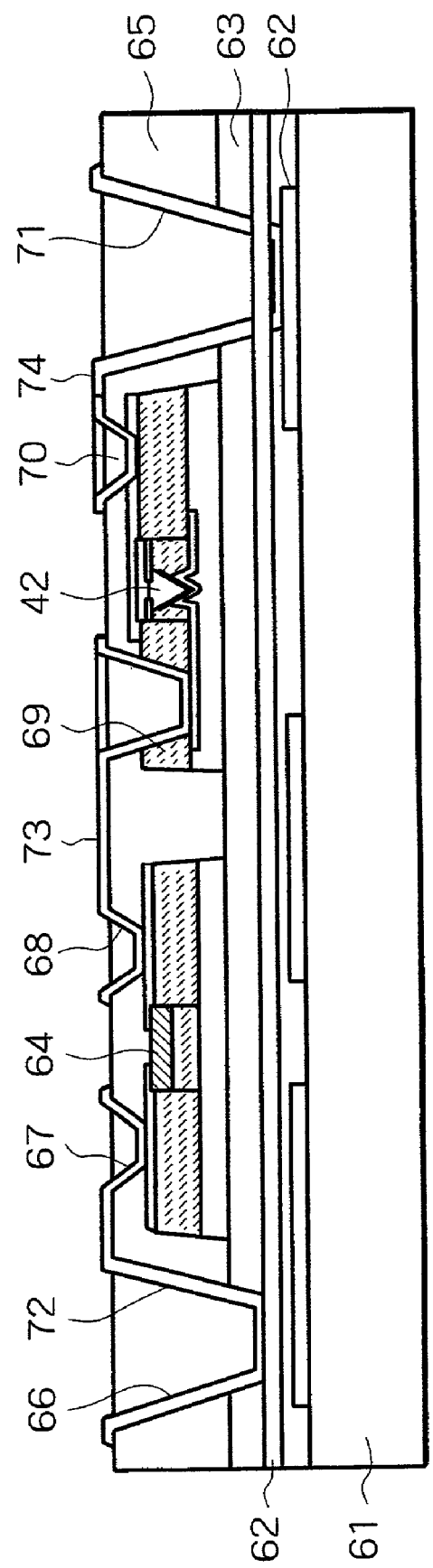
FIG. 27 is a schematic sectional view showing a step of forming wiring.

As shown in FIG. 26, an insulating layer 65 is formed in such a manner as to cover the light emitting diodes 42 and 64, each of which is in the form of the resin-covered chip. The insulating layer 65 may be made from a transparent epoxy type adhesive, an UV-curing type adhesive, or polyimide. The formation of the insulating layer 65 is followed by formation of wiring. FIG. 27 is a view showing a wiring forming step, in which openings 66, 67, 68, 69, 70, and 71 are formed in the insulating layer 65, and wiring lines 72, 73, and 74 for connecting electrode pads for anodes and cathodes of the light emitting diodes 42 and 64 to the wiring layer 62 of the second substrate 61 are formed. Since the areas of the electrode pads of the light emitting diodes 42 and 64 are large, the shapes of the openings, that is, via-holes, can be made large, with a result that the positioning accuracy of each via-hole may be made rough as compared with a via-hole directly formed in each light emitting diode. For example, since each of the electrode pads has a size of about 60 μm square as described above, the via-hole having a diameter of about 20 μm can be formed. The via-holes are of three kinds that are connected to the wiring substrate, the anode electrode, and the cathode electrode. The depth of each via-hole is optimized by controlling a pulse number of a laser beam depending on the kind of the via-hole.

After the wiring in the above-described wiring step is ended, an emission test is performed. As a result of this test, if a light emitting diode is not activated and at this time wiring is non-defective, then it may be estimated that the cause of non-activation of the light emitting diode is due to the fact that the light emitting diode may be defective. In this case, the defective light emitting diode is required to be repaired, for example, by exchange of a resin-covered chip. However, since the pitch of the adjacent resin-covered chips is as small as about 200 μm and the resin-covered chip is buried in the insulating layer 65, it is very difficult to remove the resin-covered chip containing the defective light emitting diode, and instead mount a new resin-covered chip and re-arrange the corresponding insulating layer and wiring. For this reason, according to the present invention, a defective pixel is repaired by additionally mount a new resin-covered chip for repair without removal of the resin-covered chip in which a defective light emitting diode is buried.

Figure 28:
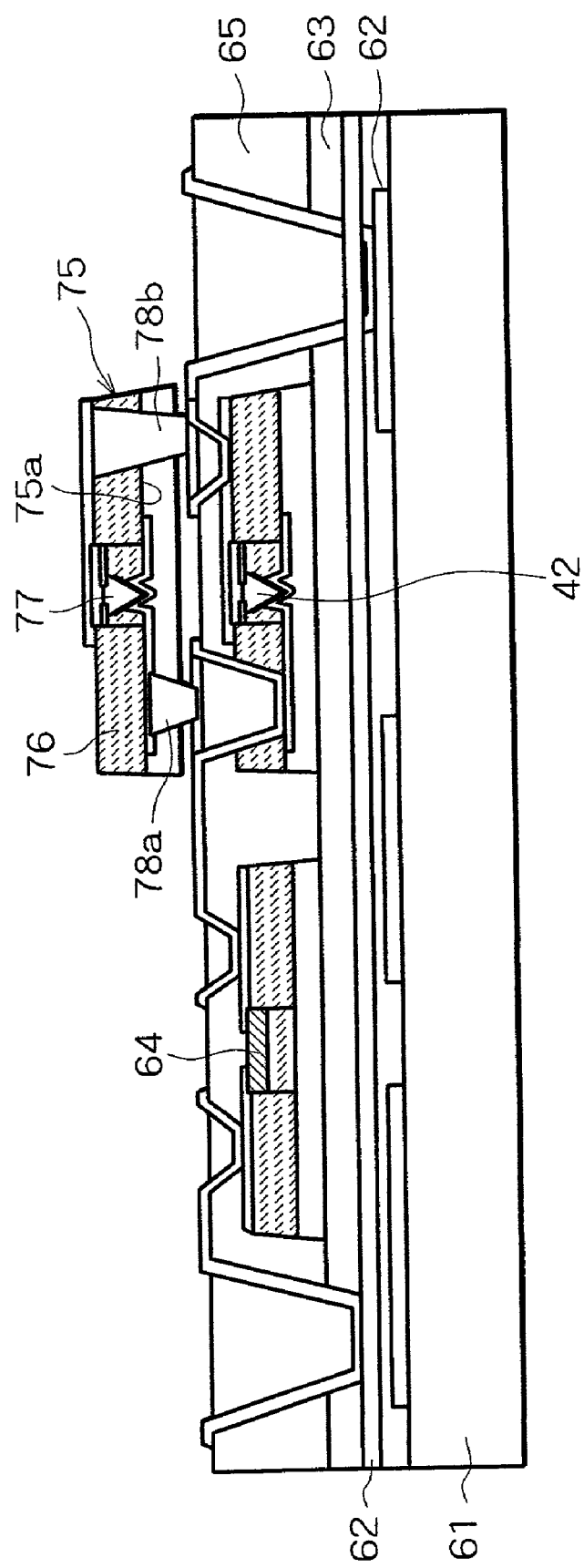
FIG. 28 is a schematic sectional view showing a step of mounting a resin-covered chip for repair.

FIG. 28 is a view showing a state that a resin-covered chip for repair is additionally mounted. To be more specific, a new resin-covered chip is additionally mounted for repair of the defective light emitting diode 42. A resin-covered chip 75 for repair has a structure that a light emitting diode 77 is buried in an approximately central portion of a resin 76. Electrode lands 78a and 78b for applying a current to the light emitting diode 77 in the resin-covered chip 75 are provided on a contact surface 75a, to be in contact with the second substrate 61, of the resin-covered chip 75. The electrode lands 78a and 78b are disposed on the contact surface 75a of the resin-covered chip 75 at positions being nearly point-symmetric with respect to the center of the contact surface 75a of the resin-covered chip 75. When the resin-covered chip 75 is additionally mounted, these electrode lands 78a and 78b are electrically connected to the above-described wiring lines 73 and 74, respectively.

Figure 29:
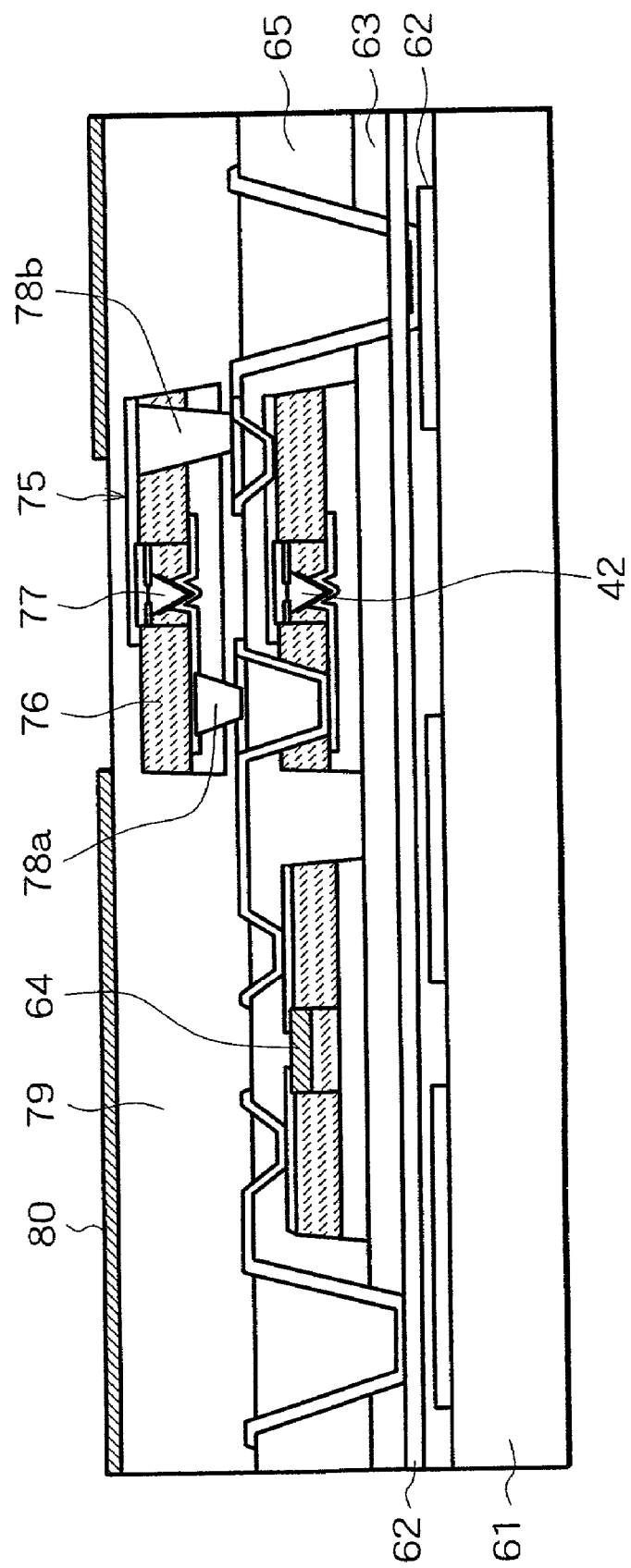
FIG. 29 is a schematic sectional view showing a step of forming a protective layer and a black mask.

After the defective pixel is thus repaired, as shown in FIG. 29, a protective layer 79 is formed and a black mask 80 is formed, to accomplish a panel of an image display unit. The protective layer 79 is the same as the insulating layer 65 shown in FIG. 25; that is, it can be made from a material such as a transparent epoxy adhesive. The protective layer 79, which is formed to perfectly cover the wiring, is cured by heating. After that, driver ICs are connected to the wiring lines at ends of the panel, to produce a drive panel.

Figure 30:
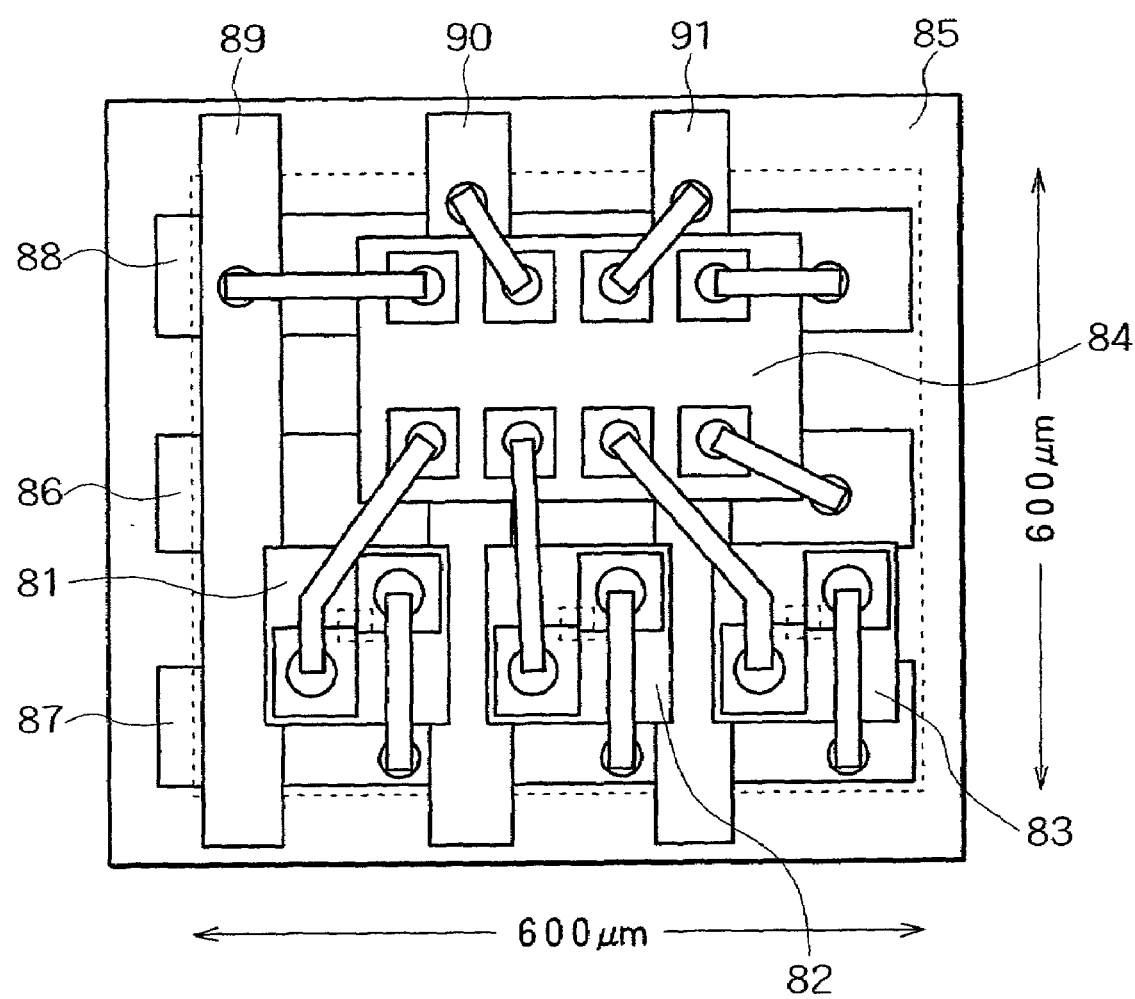
FIG. 30 is a schematic plan view of a pixel portion.

The additional mounting of the resin-covered chip 75 for repair makes it possible to eliminate the need for removal of the resin-covered chip in which the defective light emitting diode 42 is buried, and hence to significantly simply repair the defective pixel without any complicated work. The additional mounting of the resin-covered chip for repair will be more fully described below. FIG. 30 is a view showing one example of a structure of an image display unit. In this figure, one of a large number of pixels and its neighborhood are shown.

Within one pixel of the image display unit, a red resin-covered chip 81 containing a light emitting diode allowing emission of light of red, a blue resin-covered chip 82 containing a light emitting diode allowing emission of light of blue, a green resin-covered chip 83 allowing emission of light of green, and a drive transistor 84 for driving the light emitting diodes are disposed on a display substrate 85 made from transparent glass. An array pitch of the resin-covered chips 81, 82 and 83 are set to about 200 μm. On the other hand, a wiring pattern for wiring the resin-covered chips 81, 82, and 83 and the drive transistor 84 is previously formed on the display substrate 85. The wiring pattern includes a power line 86, a power line 87, an address line 88, and signal lines 89, 90 and 91. The resin-covered chips 81, 82, and 83 and the drive transistor 84 are connected to these wiring lines, to be thus electrically connected to each other.

Figure 31:
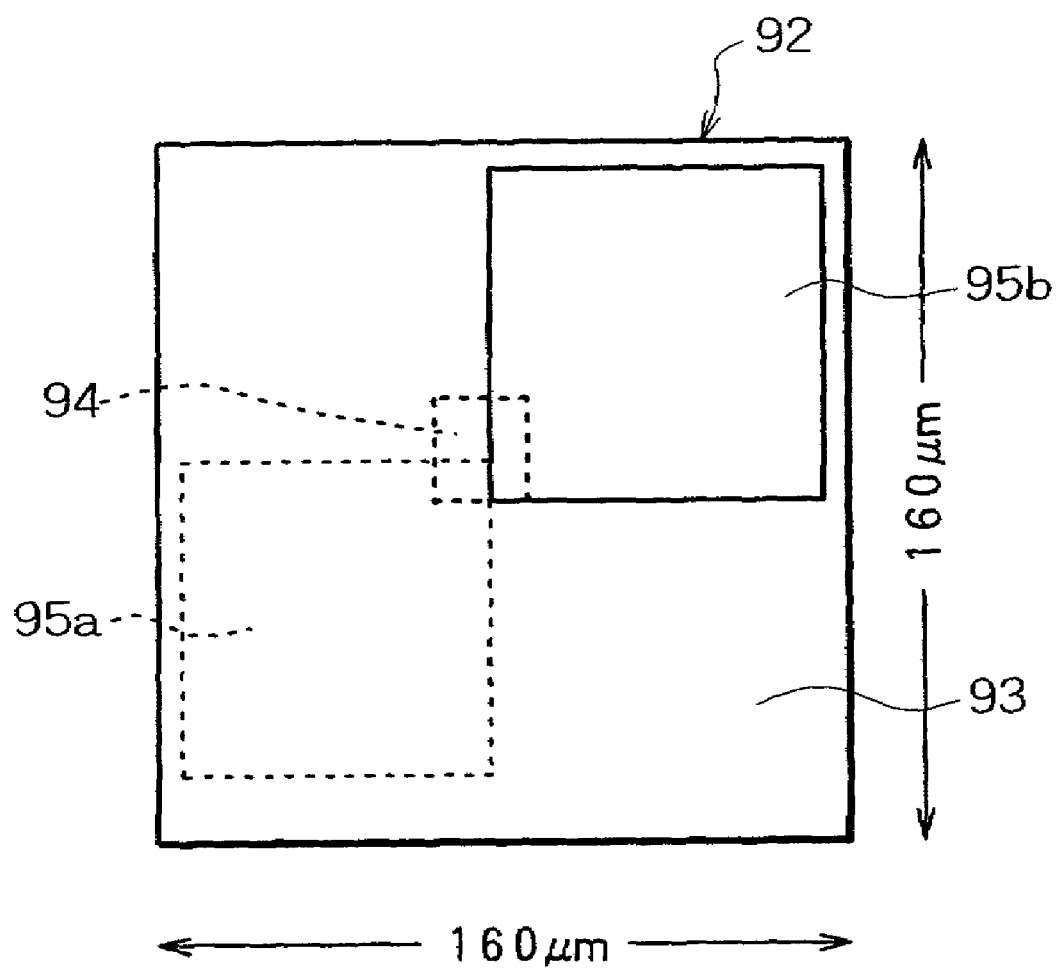
FIG. 31 is a schematic plan view of a resin-covered chip.

The structure of each resin-covered chip will be described again below. FIG. 31 is a schematic plan view showing a resin-covered chip 92 in which a light emitting diode 94 is buried in an approximately central portion of a resin 93. The resin-covered chip 92 has a size of 160 μm square and a thickness of about 40 μm. Electrode lands 95a and 95b for applying a current to a light emitting diode buried in the resin-covered chip 92 are disposed on a surface of the resin 93 at positions substantially point-symmetric with respect to the center of the surface of the resin 93.

Figure 32:
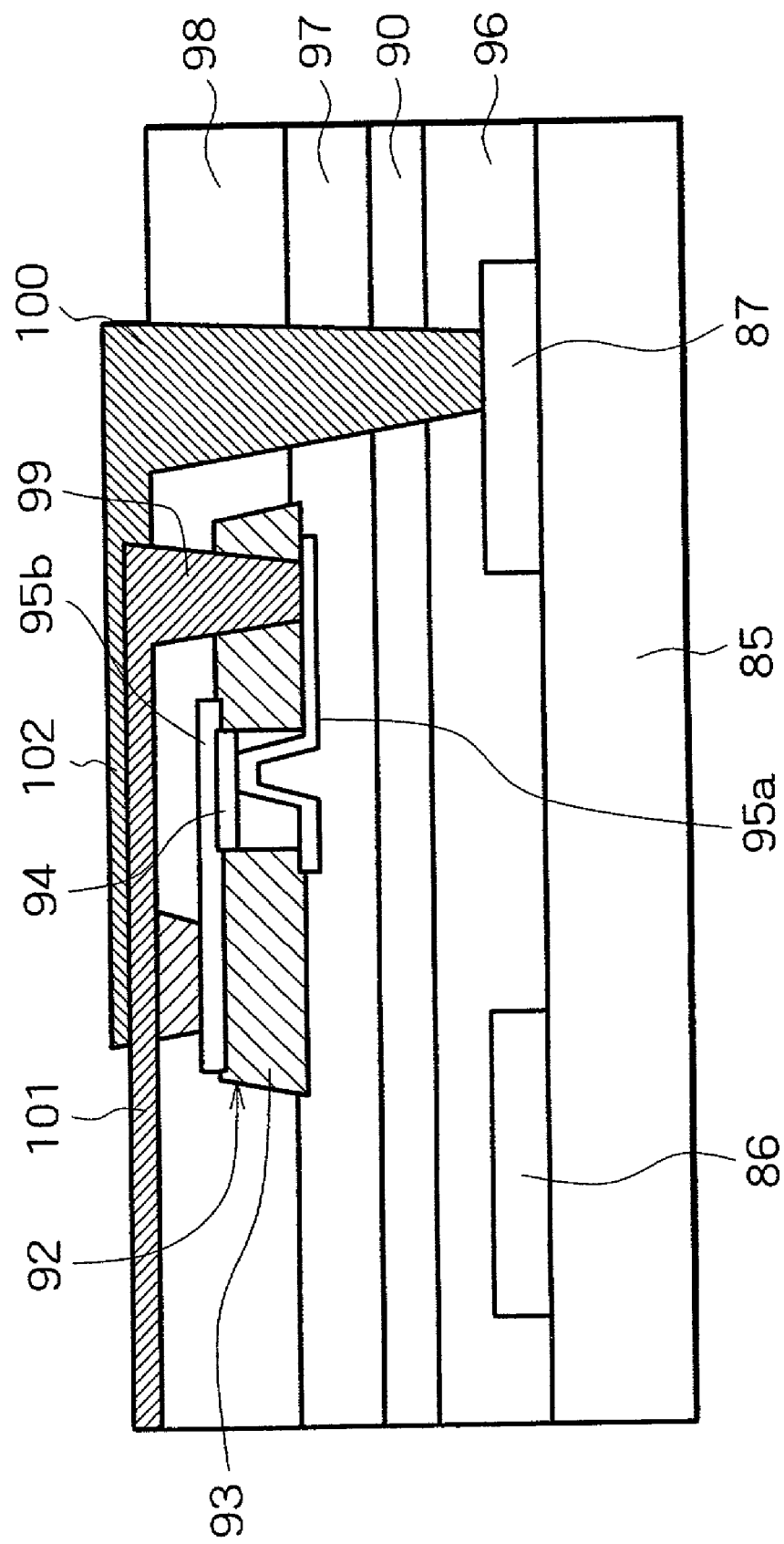
FIG. 32 is a schematic sectional view showing connection between a resin-covered chip and a wiring pattern.

Each resin-covered chip is connected to a wiring pattern formed on the display substrate as described above. FIG. 32 is a sectional view showing one example of the connection between the resin-covered chip 92 and the wiring pattern, wherein the resin-covered chip 92 and the wiring pattern (power lines 86 and 87 and signal line 90 in the figure) are stacked on the display substrate 85 via, for example, insulating layers 96, 97, and 98 made from a transparent resin. Holes extending in the vertical direction are opened in the insulating layers 96, 97, and 98, and then the holes are buried with a conductive material, to form wiring lines 99 and 100 for interlayer connection. Extracting wiring lines 101 and 102 are disposed in such a manner as to be connected to the wiring lines 99 and 100 for interlayer connection, respectively, whereby the electrode land 95a of the resin-covered chip 92 is electrically connected to the drive transistor 84 and the electrode land 95b of the resin-covered chip 92 is electrically connected to the power line 87.

Figure 33:
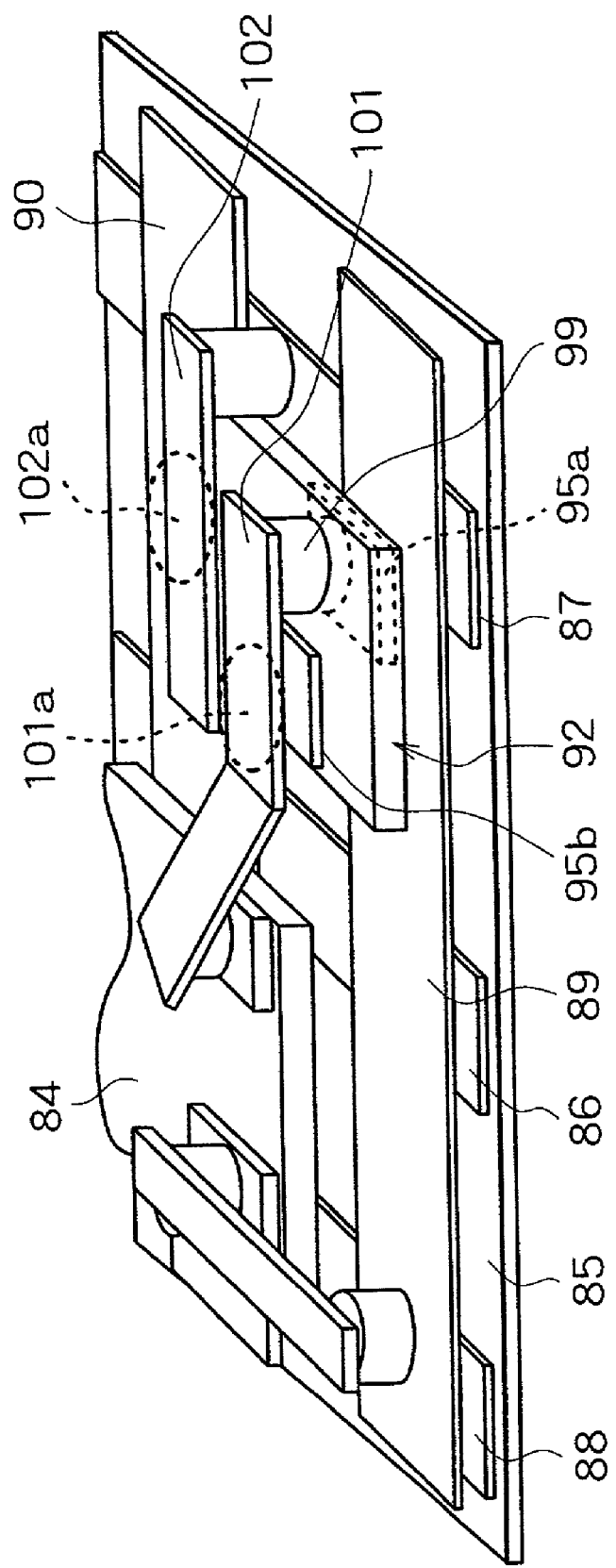
FIG. 33 is a schematic plan view showing connection between the resin-covered chip and the wiring pattern.
Figure 34:
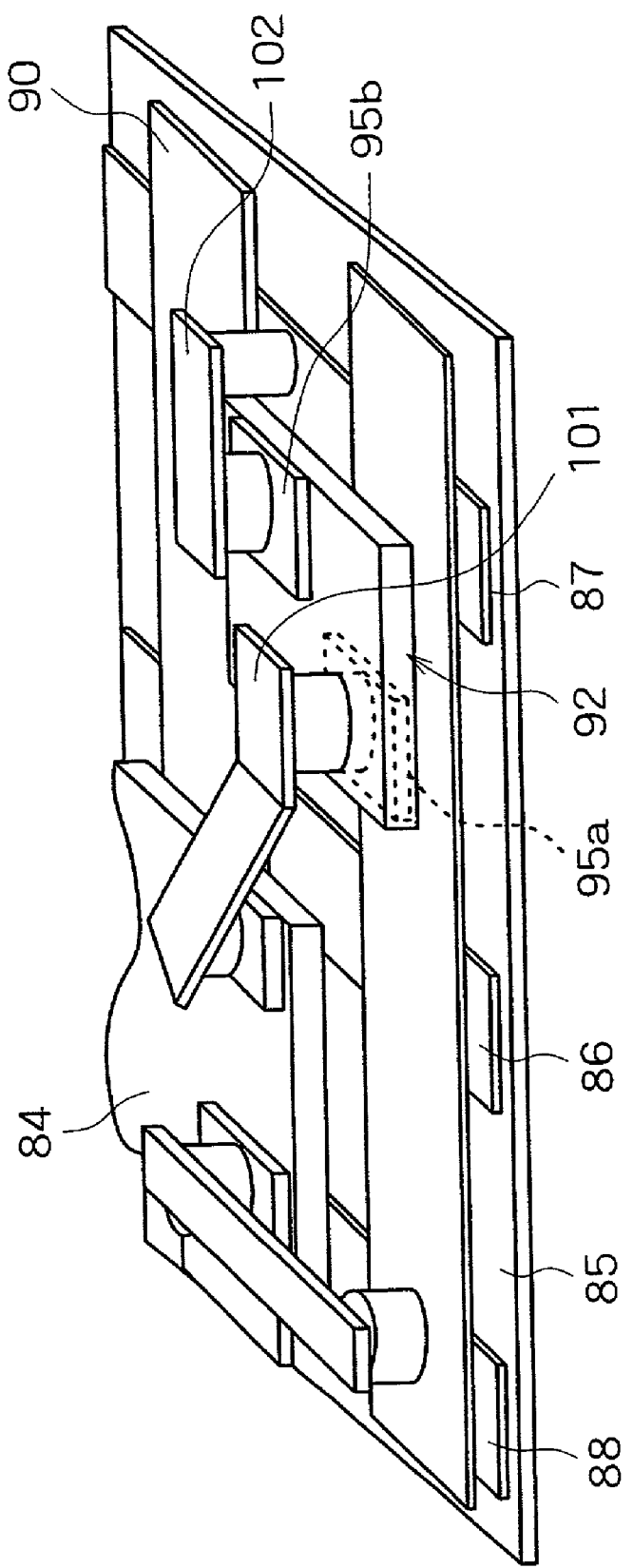
FIG. 34 is a schematic perspective view showing the connection state between the resin-covered chip and the wiring pattern in the case where lengths of extracting wiring lines are designed to be shortest.

FIG. 33 is a perspective view showing the above-described connection state. It is to be noted that in FIG. 33, the insulating layers 96, 97, and 98 are omitted. To achieve effective wiring of the resin-covered chip 92, the wiring design is usually performed in such a manner that the length of each of the extracting wiring lines 101 and 102 is shortest as shown in FIG. 34. On the contrary, according to this embodiment, as shown in FIG. 33, the extracting wiring lines 101 and 102 are designed to have excess portions 101a and 102a, respectively, by changing positions of the electrode lands 95a and 95b of the resin-covered chip 93. The excess portions 101a and 102a are used as electrode lands to be electrically connected to a resin-covered chip for repair.

Figure 35:
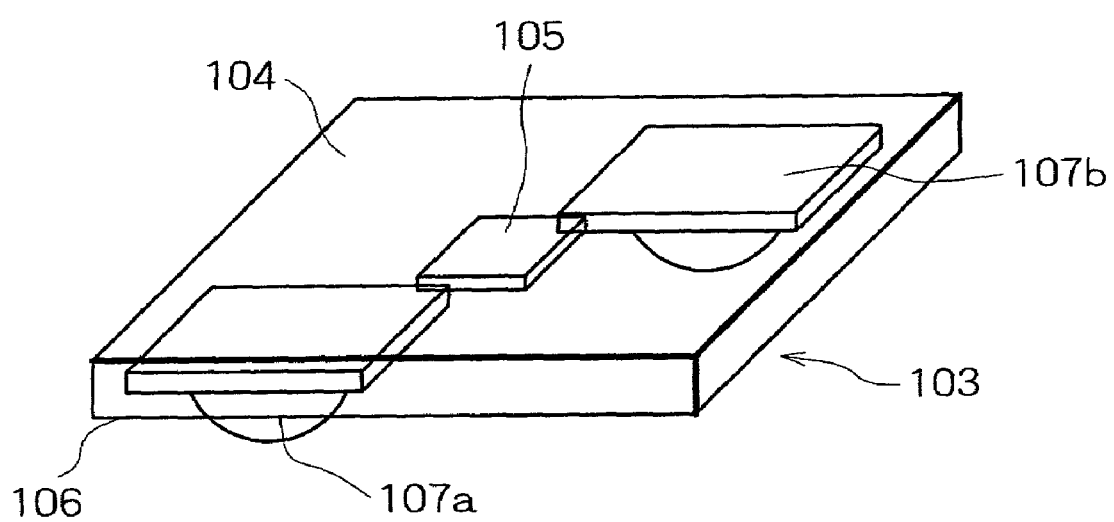
FIG. 35 is a schematic perspective view of the resin-covered chip for repair.

FIG. 35 is a view showing a structure of a resin-covered chip 103 for repair. The resin-covered chip 103 for repair has an outer size being nearly equal to that of the resin-covered chip 92, and has a structure that a light emitting diode 105 is buried in an approximately central portion of a resin 104. Electrode lands 107a and 107b for applying a current to the light emitting diode 105 are provided on a contact surface 106, to be in contact with the display substrate 85, of the resin 104 at positions being nearly point-symmetric with respect to the center of the resin 104.

Figure 36:
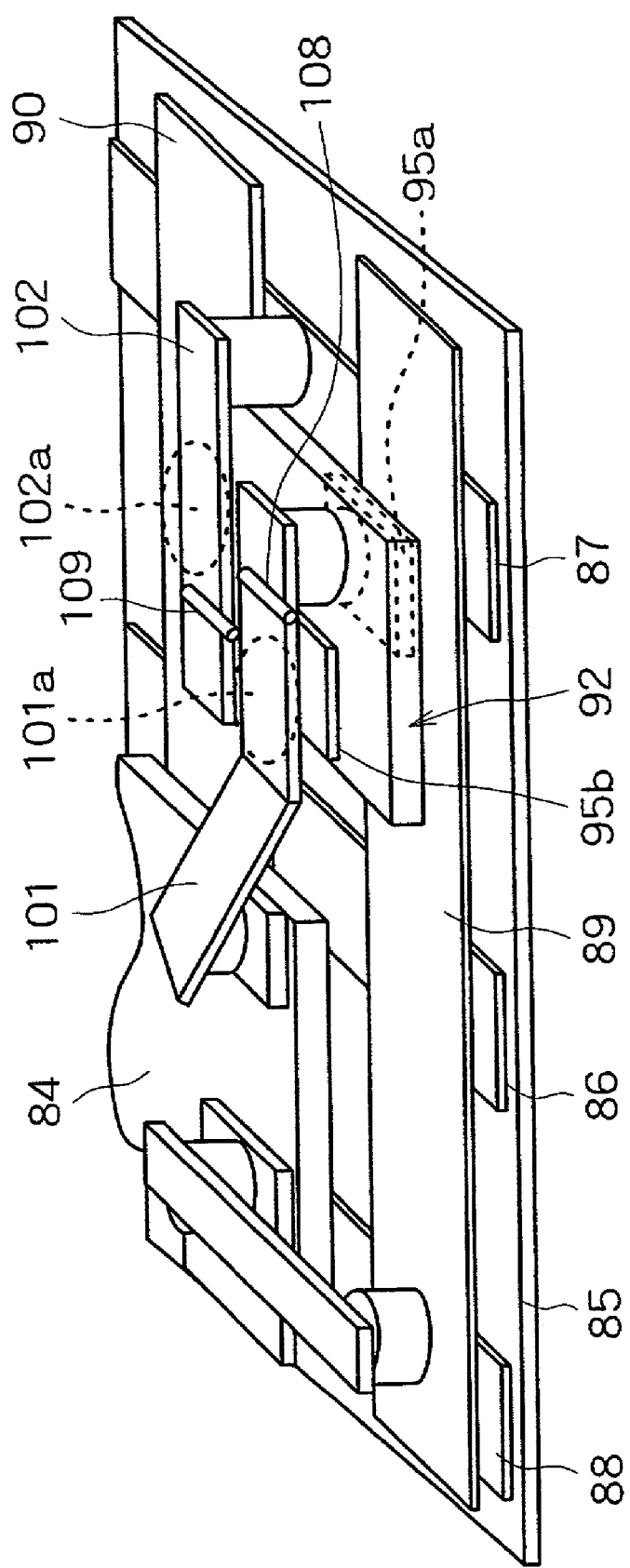
FIG. 36 is a schematic perspective view showing a step of cutting wiring lines.
Figure 37:
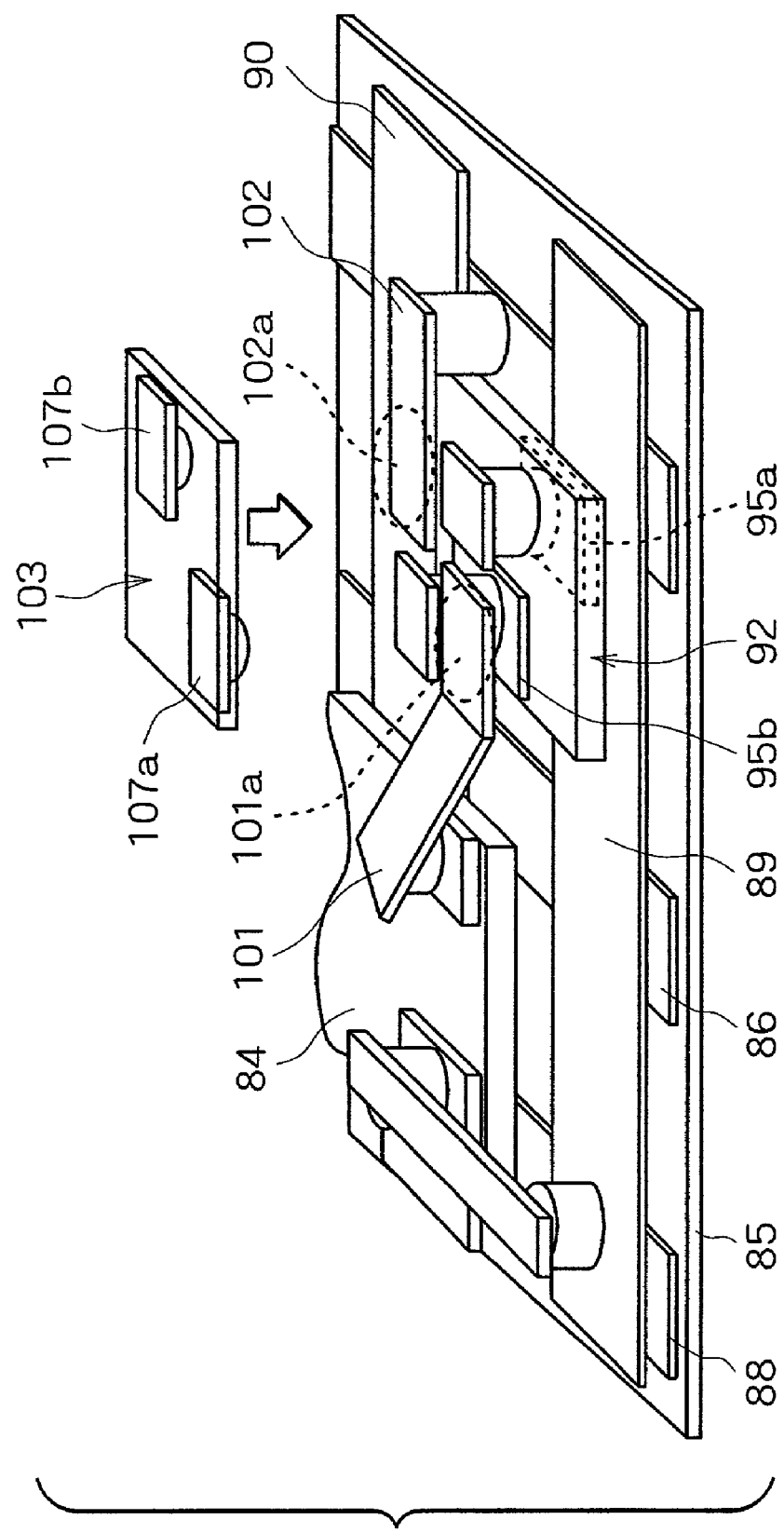
FIG. 37 is a schematic perspective view showing a step of mounting the resin-covered chip for repair.

When a defective resin-covered chip 92 is detected, the extracting wiring lines 101 and 102 are first cut at positions near the electrode lands 95a and 95b; for example, cut at lines 108 and 108 shown in FIG. 36 in order to prevent the current-carrying to the defective resin-covered chip 92. Subsequently, as shown in FIG. 37, a resin-covered chip 103 for repair is mounted at a position nearly overlapped to a position of the defective resin-covered chip 92. At this time, electrode lands 107a and 107b of the resin-covered chip 103 for repair are brought into contact with the excess portions 101a and 102a of the extracting wiring lines 101 and 102 shown in FIG. 33, to be electrically conducted thereto. As a result, a drive current can be supplied to a light emitting diode 105 buried in the resin-covered chip 103 for repair without formation any new wiring lines.

Figure 38:
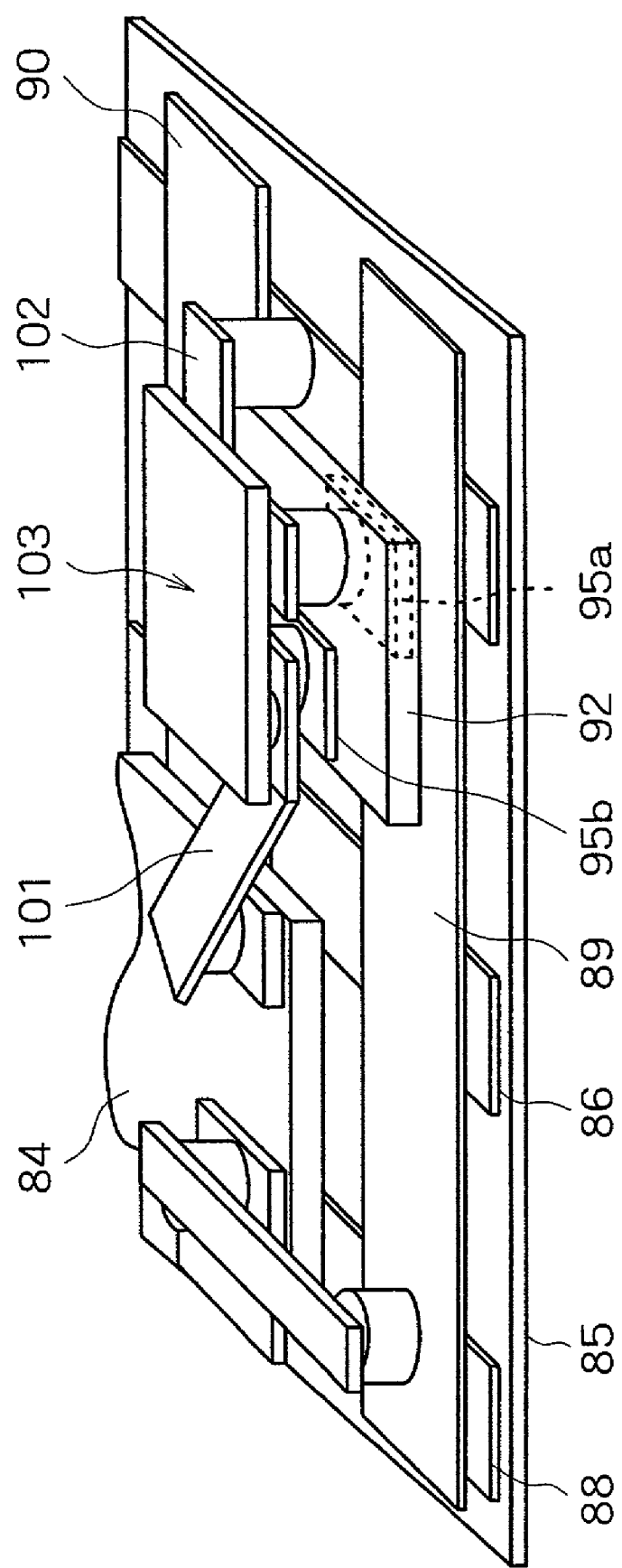
FIG. 38 is a schematic perspective view showing a mounting state of the resin-covered chip for repair.
Figure 39:
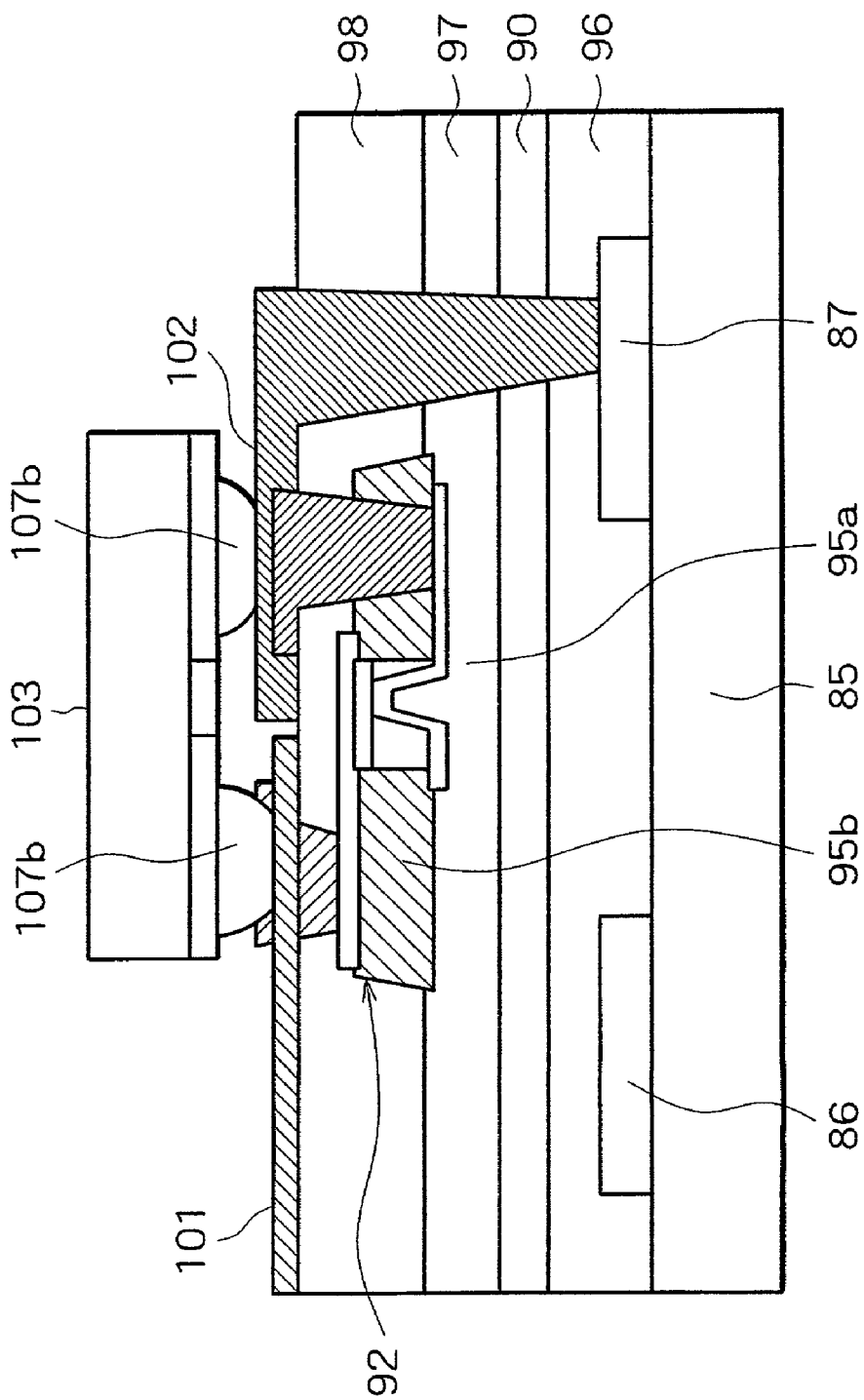
FIG. 39 is a schematic sectional view showing the mounting state of the resin-covered chip for repair.

Finally, the resin-covered chip 103 is perfectly fixed as shown in FIG. 38, to complete the repair of the defective pixel. FIG. 39 is a sectional view showing a state that the defective pixel is repaired by mounting the resin-covered chip 103 on the defective resin-covered chip 92. As described above, by predetermining array postures of resin-covered chips and shapes of wiring lines in consideration of repair, it is possible to repair, without the step for removal of the resin-covered chip that has been already mounted, a detective pixel resulting from a defective resin-covered chip by a simple step that is carried out by cutting part of wiring lines and additionally mounting and fixing a repair chip.

As described above, according to the device mounting substrate and the defective device repairing method of the present invention, the repair of a defective device (for example, the repair of a non-activated pixel due to a defective LED device) can be performed without complicated, microscopic works such as removal of the defective device forcibly fixed and repair of an insulating layer. The device mounting substrate and the defective device repairing method of the present invention also have the following advantages. Since the repair chip has a structure and a size similar to those of the resin-covered chip, and can be produced by a process being substantially the same as that for producing the resin-covered chip, with a result that it is possible to carry out the repair without the need for development of a new process. Since the modified points of the display structure lie in both the posture of the resin-covered chip and the lengths of wiring lines, it is possible to carry out the repair without exerting any effect on the production process. Since the manner of mounting the resin-covered chip can be applied to the process of mounting a repair chip, it is possible to eliminate the need for development of a new process even from this viewpoint. Since a repair chip is disposed on the uppermost layer of a display structure, even if there occurs an inconvenience for the repair chip, then the repair chip can be removed easily or repaired again. In addition, the present invention makes it possible to perform not only the repair in a production line of an assembly factory, but also the repair of a non-activated pixel, which is caused due to a defective resin-covered chip, after shipping of a final product. Meanwhile, since the image display unit and its production method according to the present invention can utilize the above-described advantages, light emitting devices formed in a dense state, that is, with a high degree of integration by fine processing can be effectively re-arrayed in such a manner that the devices are enlargedly spaced from each other. As a result, it is possible to significantly improve the productivity of an image display unit with a high accuracy.

While the preferred embodiments of the present invention have been described using specific terms, such description is for illustrative purposes only, and it is to be understood that changes and variations may be made without departing from the spirit or scope of the following claims.

The invention claimed is:

1. A method of producing an image display unit including light emitting devices arrayed on a substrate in a matrix and being electrically connected to wiring lines, each of the light emitting devices forming a pixel, the method comprising the steps of:
   transferring the light emitting devices from a first substrate to a temporary holding member such that the light emitting devices transferred on the temporary holding member are enlargedly spaced from each other with a pitch larger than a pitch of the light emitting devices arrayed on the first substrate, and holding the light emitting devices on the temporary holding member;
   transferring the light emitting devices held on the temporary holding member to a second substrate such that the light emitting devices transferred on the second substrate are more enlargedly spaced from each other with a pitch larger than the pitch of the light emitting devices held on the temporary holding member;
   electrically connecting the devices, which have been arrayed on the second substrate so as to be spaced from each other, to wiring lines connected to a drive circuit;
   detecting a defective device; and
   mounting a light emitting device for repair at a position corresponding to a position of the defective light emitting device.

2. A method of producing an image display unit as claimed in claim 1, wherein after wiring lines connected to the defective light emitting device are cut off, the repair device is electrically connected to portions of the wiring lines, the portions of the wiring lines being located at positions nearer to a drive circuit side than the cut-off positions of the wiring lines.

* * * * *